United States Patent [19]

Kato et al.

[11] Patent Number: 5,135,606

[45] Date of Patent: Aug. 4, 1992

[54] PROCESS FOR PREPARING ELECTRICAL CONNECTING MEMBER

[75] Inventors: Tomoaki Kato, Sagamihara; Tetsuo Yoshizawa, Yokohama; Toyohide Miyazaki, Ibaraki; Hiroshi Kondo, Osaka; Takashi Sakaki, Tokyo; Yoshimi Terayama, Odawara; Yoichi Tamura, Tokyo; Takahiro Okabayashi, Tokyo; Kazuo Kondo, Tokyo; Yasuo Nakatsuka, Tokyo; Yuichi Ikegami, Osaka, all of Japan

[73] Assignees: Canon Kabushiki Kaisha, Tokyo; Sumitomo Metal Industries, Ltd., Osaka, both of Japan

[21] Appl. No.: 623,521

[22] Filed: Dec. 7, 1990

[30] Foreign Application Priority Data

| Dec. 8, 1989 | [JP] | Japan | 1-319953 |
| Dec. 11, 1989 | [JP] | Japan | 1-321735 |
| Dec. 22, 1989 | [JP] | Japan | 1-333056 |
| Mar. 30, 1990 | [JP] | Japan | 2-85414 |
| Mar. 30, 1990 | [JP] | Japan | 2-85415 |
| Mar. 30, 1990 | [JP] | Japan | 2-85416 |
| Mar. 30, 1990 | [JP] | Japan | 2-85418 |
| Mar. 30, 1990 | [JP] | Japan | 2-85419 |
| Aug. 20, 1990 | [JP] | Japan | 2-220457 |

[51] Int. Cl.$^5$ .................. C23F 1/00; B44C 1/22; B29C 37/00

[52] U.S. Cl. .................. 156/631; 29/876; 156/634; 156/644; 156/656; 156/659.1; 156/661.1; 156/668; 156/902; 205/135

[58] Field of Search ........... 156/630, 631, 634, 644, 156/656, 659.1, 661.1, 668, 902; 204/15; 430/314, 313, 318, 317; 228/180.2, 110; 29/825, 841, 852, 860, 876, 884; 439/66; 427/97

[56] References Cited

U.S. PATENT DOCUMENTS

| 4,604,160 | 8/1986 | Murakami et al. | 156/631 X |
| 4,814,040 | 3/1989 | Ozawa | 156/902 X |
| 4,926,549 | 5/1990 | Yoshizawa et al. | 29/876 |
| 5,058,800 | 10/1991 | Yoshizawa et al. | 228/180.2 |

FOREIGN PATENT DOCUMENTS

| 59-996 | 1/1984 | Japan . |
| 63-133401 | 6/1988 | Japan . |
| 63-222437 | 9/1988 | Japan . |
| 63-224235 | 9/1988 | Japan . |

Primary Examiner—William A. Powell
Attorney, Agent, or Firm—Fitzpatrick, Cella, Harper & Scinto

[57] ABSTRACT

A process for preparing an electrical connecting member having a holding member with an electrically insulating material, and a plurality of electroconductive members. The electroconductive members are mutually insulated from each other and one end of each of the electroconductive members is exposed at one surface of the holding member and the other end is exposed at another surface of the holding member. A holding member is formed by forming a layer on a base member with the holding member having a photosensitive resin on the uppermost surface of the layer. The holding member is exposed and developed by forming a plurality of holes through the holding member, thereby exposing the uppermost surface of the layer. A part of the exposed layer is etched away and the holes on the holding member are filled with an electroconductive member. The remaining layer and base member are then removed.

63 Claims, 29 Drawing Sheets

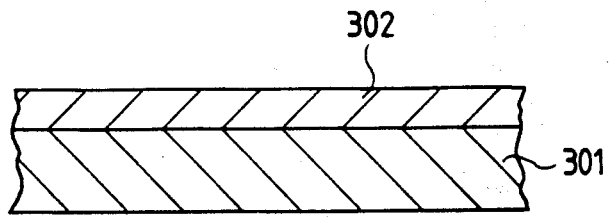
FIG. 6A
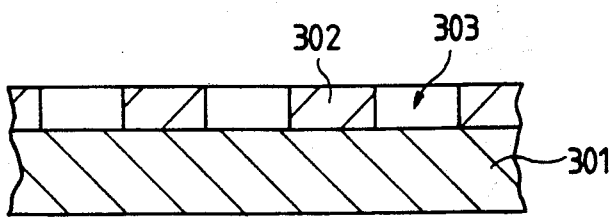
FIG. 6B
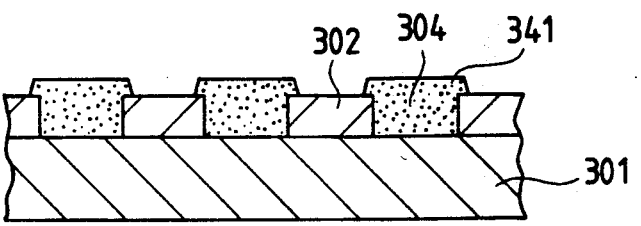
FIG. 6C
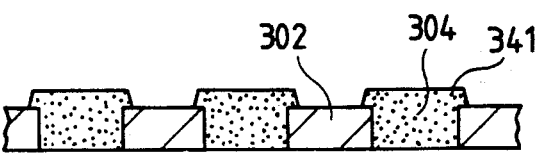
FIG. 6D
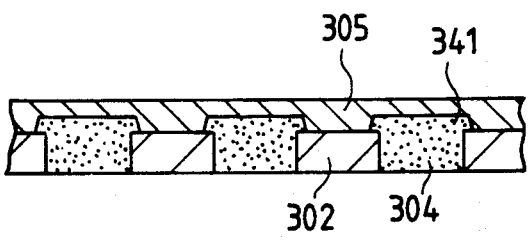
FIG. 6E-1
FIG. 6E-2
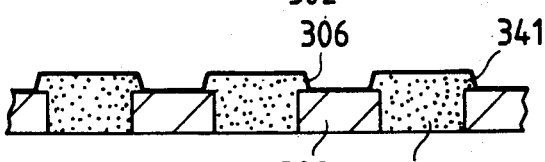
FIG. 6F
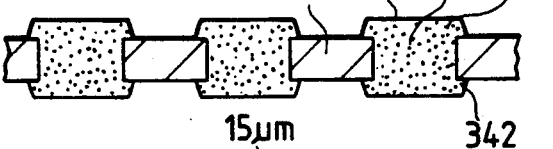
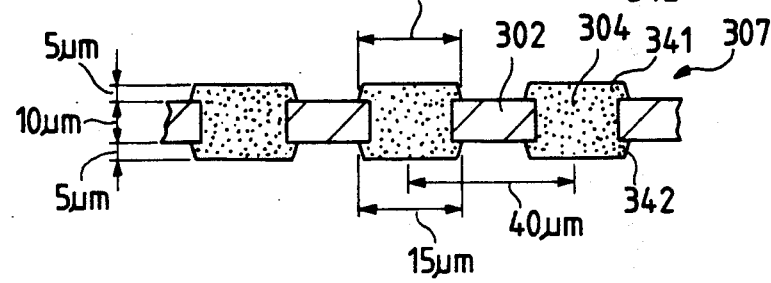
FIG. 6G

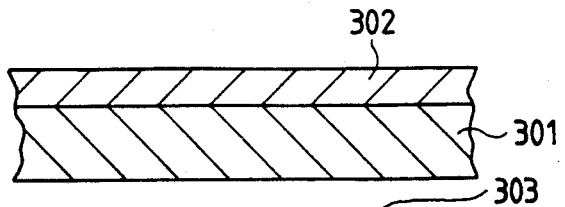
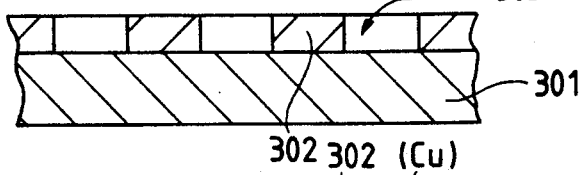
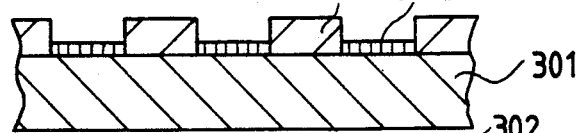
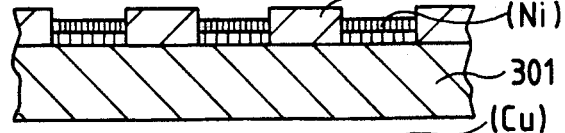
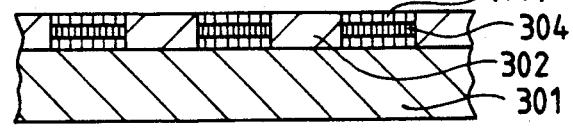
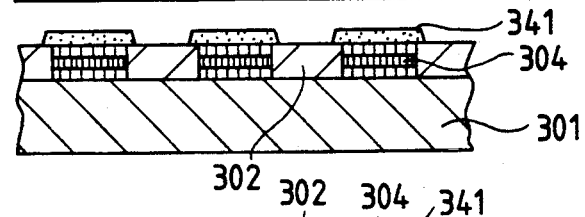
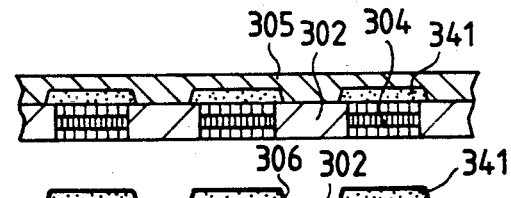
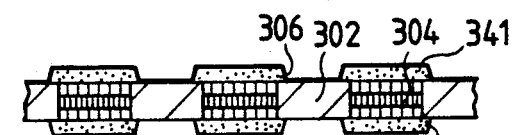
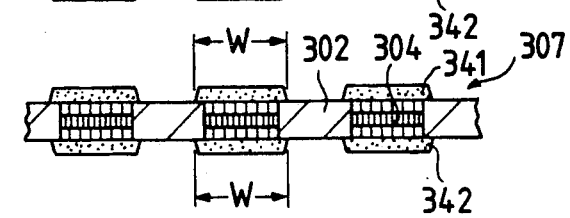

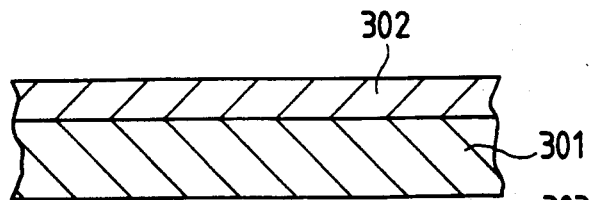
FIG. 10A
FIG. 10B
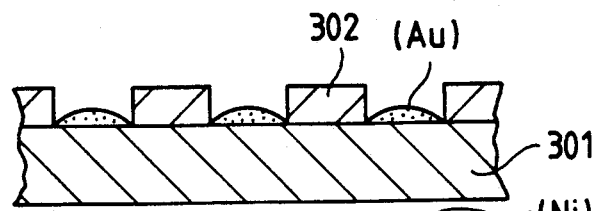
FIG. 10C-1
FIG. 10C-2
FIG. 10C-3
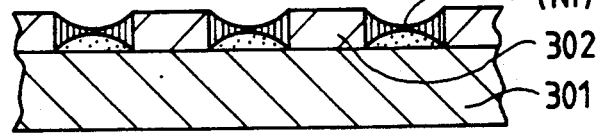
FIG. 10D
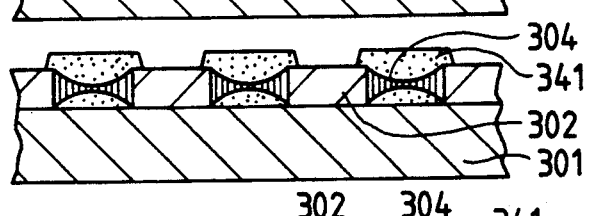
FIG. 10E-1
FIG. 10E-2
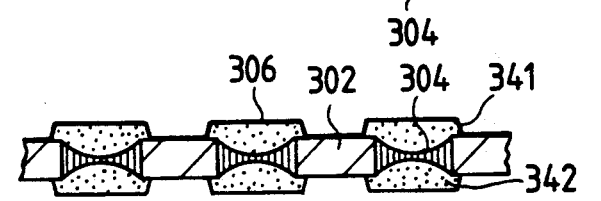
FIG. 10F
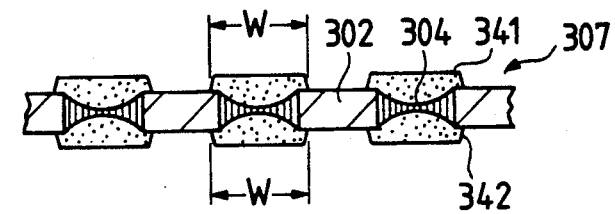
FIG. 10G

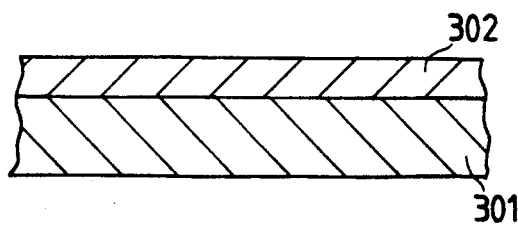
FIG. 11A
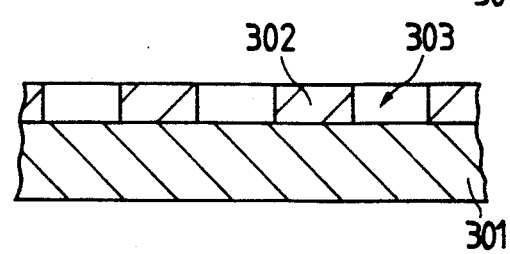
FIG. 11B
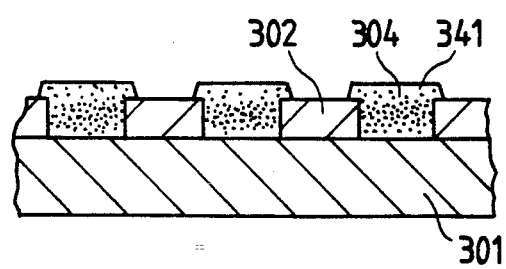
FIG. 11C
FIG. 11D
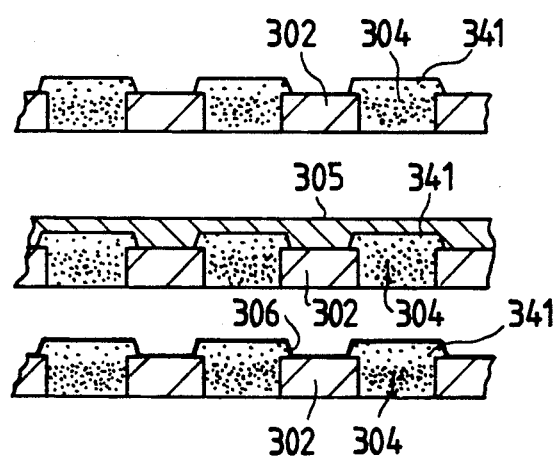
FIG. 11E-1
FIG. 11E-2
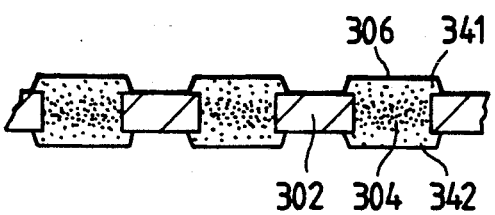
FIG. 11F
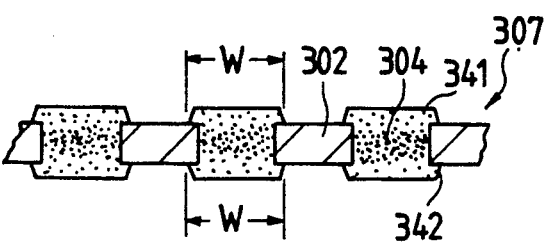
FIG. 11G

FIG. 14K

PROCESS FOR PREPARING ELECTRICAL CONNECTING MEMBER

BACKGROUND OF THE INVENTION

1. Field of the Invention

This invention relates to a process for preparing an electrical connecting member to be used in connecting electrically electrical circuit parts to each other.

2. Related Background Art

In the prior art, as the method for connecting electrically electrical circuit parts to each other, the wire bonding method, TAB (Tape Automated Bonding) method, etc. have been known. However, in these methods, there have been drawbacks in that they cannot correspond to the increase of connecting points between the both electrical circuit parts, and are also high in cost. In order to solve such drawbacks, it has been known in the art to connect electrical circuit parks to each other by use of an electrical connecting member having a constitution equipped with a plurality of electroconductive members insulated from each other in an insulating holding member (Japanese Laid-open Patent Applications Nos. 63-222437, 63-224235, etc.).

FIGS. 1A and 1B illustrate schematically such electrical connecting member and electrical connection between the electrical circuit parts by use thereof, and in the Figures, 31 shows the electrical connecting member, and 32, 33 show the electrical circuit parts to be connected. The electrical connecting member 31 is constituted of a plurality of electrical members 34 comprising a metal or an alloy equipped in the holding member 35 comprising an electrically insulating material with the electroconductive members 34 being electrically insulated from each other, and has one end 38 of the electroconductive member 34 protruded on one side of the electrical circuit part 32, and the other end 39 of the electroconductive member 34 protruded on the other side of the electrical circuit part 33 (FIG. 1A). To the connecting portion 36 of one electrical circuit part 32 one protruded end 38 of the electroconductive member 34 is bonded by deformation according to pressure adhesion, thermal pressure adhesion, etc., and to the connecting portion 37 of the other electrical circuit part 33 is the other protruded end 39 protruded of the electroconductive member 34 is bonded by pressure adhesion, thermal pressure adhesion, etc. (FIG. 1B). Thus, the corresponding connecting portions 36, 37 of the electrical circuit parts 32, 33 are connected to each other.

With such an electrical connecting member, there are advantages as shown below.

(1) By making the size of the electroconductive member smaller, the connecting portion of the electrical circuit part can be made compact, and, the number of connecting points can be increased, whereby higher density connection mutually between electrical circuit parts can be made.

(2) Even for electrical circuit parts with different thickness, the height of the electrical circuit parts can always be made constant by varying the thickness of the electrical connecting member, whereby multi-layer connection can be easily done to enable higher density practical mounting.

(3) By making the protruded height of the electroconductive member to be connected with the connecting portion of the electrical circuit part large, even if the connecting portion of the electrical circuit is partly sunken from the surface it can be stably connected, whereby it is possible to easily connect electrical circuit parts having complicated shapes to each other.

(4) Since the heat generated from the electrical circuit parts is dissipated through the holding member of the electrical connecting member, the electrical characteristic change is extremely small. Also, because of excellent heat dissipating characteristic, the influence of heat fatigue is small and reliability is also high.

(5) Since the connecting length mutually between the electrical circuit parts is short, impedance can be reduced and speed-up of electrical parts can be effected.

(6) Since the amount of the electroconductive member to be used in the electrical connecting member is small, the cost is low even when an expensive metal may be employed.

(7) Since the connecting portion of the electrical circuit part is formed into an alloy through the electrical connecting member, there is no variance of contact resistance and reliability of connection is high.

As the process for preparing such electroconductive member, there is one proposed in Japanese Patent Application No. 63-133401. In the following, this preparation process is described briefly by referring to FIGS. 2A-2F showing its steps schematically.

First, a substrate 51 comprising a metal sheet such as copper plate, etc. is prepared (FIG. 2A), and on the substrate 51 is coated a nega-type photosensitive resin 52 by a spin coater, which is then prebaked at a temperature around 100° C. (FIG. 2B). Through a photomask forming a predetermined pattern (not shown), light is irradiated (exposed) on the photosensitive resin 52, followed by developing. At the irradiated portion, the photosensitive resin 52 remains, while at the unirradiated portion, the photosensitive resin 52 is removed by the development, whereby a plurality of holes 53 are formed (FIG. 2C). After curing the photosensitive resin 52 by elevating the temperature to 200° to 400° C., the substrate 51 is dipped in an etchant to effect etching, thereby forming concavities 54 communicated to the holes 53 on the substrate 51 (FIG. 2D). Next, by application of gold plating with the substrate 51 as the common electrode, gold 55 is filled in the holes 53 and the concavities 54, and gold plating is continued until bumps are formed (FIG. 2E). Finally, the substrate 51 is removed by etching to prepare an electrical connecting member 31 (FIG. 2F).

In the electrical connecting member 31 thus prepared, the old 55 constitutes the electroconductive member 34, and the photosensitive resin 52 constitutes the holding member 35. The electroconductive member 34 consists of the portion 34a embedded within the holding member 35 (hereinafter called the columnar portion 34a) and the portions 34b protruded from the both surfaces of the holding member 35 (the ends 38, 39 in FIG. 1A, hereinafter called the bump portions 34b).

The bumps 38, 39 formed at both ends of the above electroconductive member 34 must to be surely connected to the connecting portions 36, 37 of the electrical circuit parts 32, 33 on the both sides.

Ordinarily, when the electroconductive member 34 of the above electrical connecting member 31 is connected by alloy formation with the electrical circuit parts 32, 33, the connecting portions 36, 37 of the electrical circuit parts 32, 33 are bonded by pressurization, heating, and the bumps 38, 39 of the electroconductive member 34 will be deformed as accompanied with such pressurization, heating treatment to embed the voids at the connecting interface to effect separation from the impurity coating such as oxides, etc., whereby the electroconductive member 34 and the clean surfaces of the electrical circuit parts 32, 33 come into contact with each other, whereby connection is effected metallurgically.

Through such connection by pressure adhesion or thermal pressure adhesion, the bumps 38, 39 are deformed respectively to be spread in the lateral direction. If the deformation amount differs between the bumps 38 and 39 on the both sides, or the bonding state differs on the surfaces on both sides of the photosensitive resin 35, reliability of connection will be lowered undesirably.

What is important in effecting connection is control of the protruded height of the bump from the photosensitive resin 35. The bump 38 is formed by carrying out plating treatment of the electroconductive member 34 as raised up on the upper surface of the photosensitive resin 35. However, if variance of its height occurs, and also if it is desired to be formed high to some extent, the bump will be spread in the circumferential direction, whereby the adjoining bumps may sometimes contact each other to cause short circuit to occur.

Accordingly, the shapes and sizes (protruded height, area, volume) of the bumps 38, 39 formed by plating treatment together with the electroconductive member 34 are required to be made the same. However, in the preparation steps as described above, the bump 39 is formed within the framework subjected to etching in the substrate 51, namely within the concavities 54, while the bump 38 is formed in the form raised up on the upper surface of the photosensitive resin 52. Therefore, the shape and the size of the bump 39 is influenced by the progress extent of etching of the concavities 54, while the shape and the size of the bump 38 are influenced by the progress extent of the plating treatment, and therefore it is very difficult to control these progresses to the same level. Particularly, control of etching is difficult as compared with control of plating treatment, and it is difficult to form concavities 54 with constant shape and size for every etching. Further the bump 38 is influenced by the shape of its concavity 54 to form the central portion of the bump in concave, or convex shape or even in flat shape, whereby there is the problem that it is difficult to control the shapes and the sizes of the bumps to be identical or to be in any desired shape. As a consequence, connection for the electrical circuit parts on both sides cannot be effected uniformly, whereby there has ensued the technical problem that reliability of connection is lowered.

In bonding the electroconductive member of such electrical connecting member to the connecting portion of the electrical circuit part by pressure adhesion or thermal pressure adhesion, of 2- to 10-fold pressurization of conventional pressure adhesion or thermal pressure adhesion is required.

However, when a brittle material such as Si chip, etc. is employed for the electrical circuit part, the pressurizing force may become excessively great, whereby the electrical circuit part may sometimes be destroyed. Also if the heating temperature is too high, there is the problem that the function of the electrical circuit may be damaged.

However, there has not yet been proposed an effective process for preparing an electrical connecting member having a constitution which will not be destroyed by the pressurizing force during pressure adhesion or thermal pressure adhesion while controlling the bump shapes to be identical, or shaped as desired, and yet capable of accomplishing higher, finer connection between electrical circuit parts at high efficiency end low cost.

SUMMARY OF THE INVENTION

An object of the present invention is to solve the problems of the preparation process of the electrical connecting member of the prior art, and to provide a process for preparing an electrical connecting member having a constitution which will not be destroyed by the pressurizing force during pressure adhesion or thermal pressure adhesion while controlling the bump shapes to be identical or shaped as desired, and yet capable of accomplishing higher, finer connection between electrical circuit parts at high efficiency and low cost.

Another object of the present invention is to provide a process for preparing an electrical connecting member, which can control the shape of the protruded portion of the bump with good precision and can prepare an electrical connecting member having stable characteristics by forming the concavity limiting the protruded shape of the bump not on the substrate but on a layer provided on the substrate.

Still another object of the present invention is to provide a process for preparing an electrical connecting member which can effect uniform connection for the electrical circuit parts on both sides by forming no concavity by etching on the substrate, but by raising up the bumps on both ends respectively by plating treatment.

Still another object of the present invention is to provide a process for preparing an electrical connecting member having stable characteristics which can vary and further control the shape and the size of the protruded portion of the bump, by providing separate photosensitive resin layers from and sandwiching the photosensitive resin which becomes the holding member therebetween and forming holes for limiting the protruded shape and size of the bump on the photosensitive resin.

Still another object of the present invention is to provide a process for preparing an electrical connecting member which can prepare an electrical connecting member having stable characteristics, can vary and further control the shape and the size of the protruded portion of the bump, by providing the mask having holes for limiting the bump shape and size and the substrate having holes formed by etching and sandwiching the holding member therebetween.

Still another object Of the present invention is to provide an electrical connecting member which can easily effect bonding of the electroconductive member to the connecting portion of the electrical circuit parts with little deformation of the columnar portion during pressure adhesion or thermal pressure adhesion even if a low load may be applied, by making the hardness of the columnar portion of the electroconductive member higher than that of the bump portion, and a process for preparing the same.

Still another object of the present invention is to provide an electrical connecting member which can effect connection by alloy formation to the connecting portion of the electrical circuit part at lower pressure and heating temperature than in the prior art.

BRIEF DESCRIPTION OF THE DRAWINGS

FIGS. 6A through 6G are schematic sectional views showing the steps of the preparation process according to another example of the present invention;

FIGS. 9A through 9G are schematic sectional views showing the steps of the preparation process according to another example of the present invention;

FIGS. 10A through 10G are schematic sectional views showing the steps of the preparation process according to another example of the present invention;

FIGS. 11A through 11G are schematic sectional views showing the steps of the preparation process according to another example of the present invention;

FIGS. 14A through 14L are schematic sectional views showing the steps of the preparation process according to another example of the present invention;

DETAILED DESCRIPTION OF THE PREFERRED EMBODIMENT

Figure 1A:
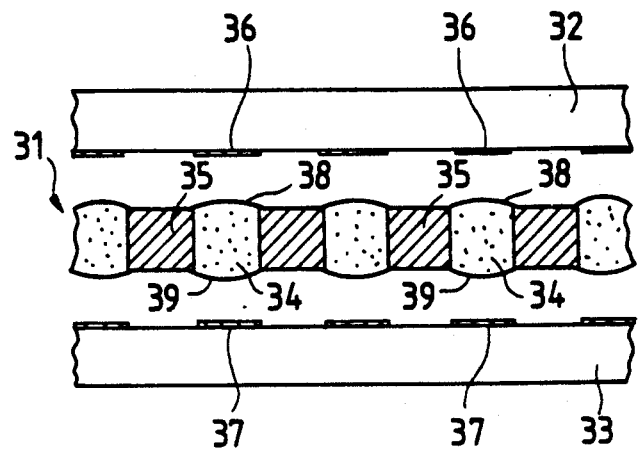
FIGS. 1A and 1B are schematic sectional views showing use examples of an electrical connecting member.
Figure 1B:
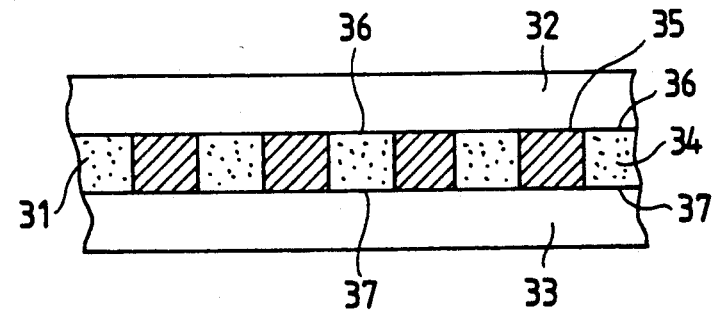
Figure 2A:
FIGS. 2A through 2F are schematic sectional views showing the steps of the process for preparing an electrical connecting member of the prior art.
Figure 2B:
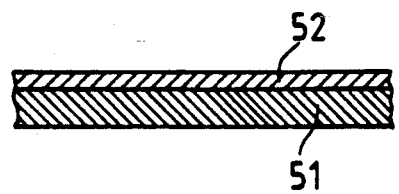
Figure 2C:
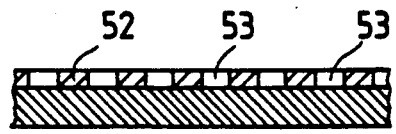
Figure 2D:
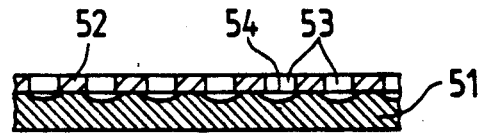
Figure 2E:
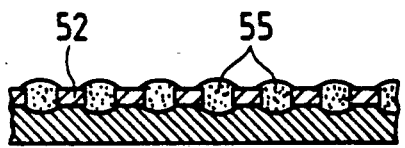
Figure 2F:
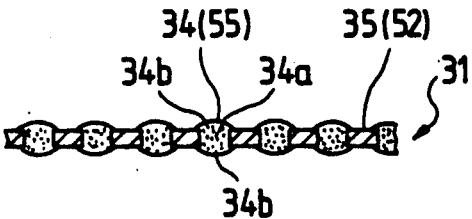

The process for preparing an electrical connecting member according to the present invention is a preparation process concerning an electrical connecting member having a holding member comprising an electrically insulating material and a plurality of electroconductive members equipped in the holding member insulated from each other, with one end of each above-mentioned electroconductive member being exposed at one surface of the above-mentioned holding member and the other end of each above-mentioned electroconductive member being exposed at the other surface. According to the process of the invention, it is possible to prepare the electrical connecting member efficiently and at low cost while controlling the shape and the size of the bump and to accomplish connections between fine electrical circuits under the constitution without breaking by pressurizing force during pressurization or heat pressurization and still be at high density.

Referring now to the drawings, examples of the process for preparing the electrical connecting member according to the present invention are described.

EXAMPLE 1

Figure 3A:
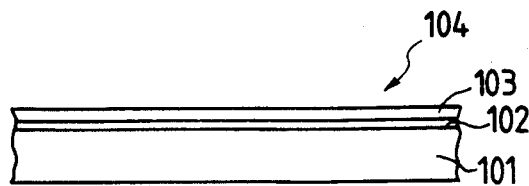
FIGS. 3A through 3F are schematic sectional views showing the steps of the preparation process according to an example of the present invention.
Figure 3B:
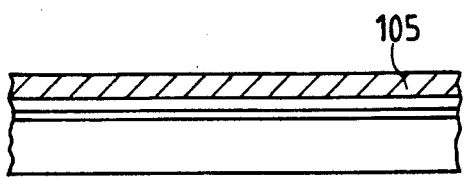
Figure 3C:
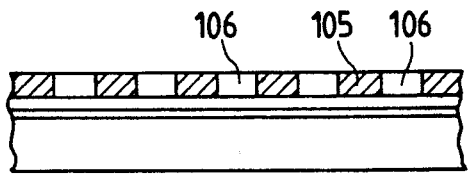

FIGS. 3A–3F are schematic sectional views showing the preparation steps of an example according to the present invention. First, on a copper foil 101 (thickness 70 μm) which becomes the base member were laminated an Ni layer 102 (thickness 2 μm) which is the first layer and a Cu layer 103 (thickness 5 μm) which is the second layer (FIG. 3A), and then a photosensitive polyimide resin 105 with a thickness of 10 μm was coated on the Cu layer 103 by a spinner, followed by pre-baking (FIG. 3B). Next light was irradiated through a photomask (not shown) on the polyimide resin 105, and the development was carried out. In this example, at the exposed portion, the polyimide resin 105 remained to become a holding member, while at the unexposed portion, the polyimide resin 105 was removed by the development processing to form holes 106 with a diameter of 90 μm (FIG. 3C). Then, the temperature was elevated to effect curing of the polyimide resin 105.

Figure 3D:
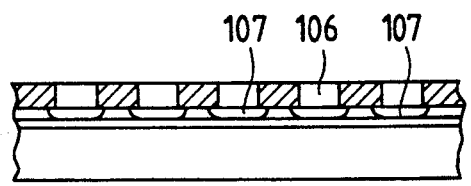

Next, the substrate 104 having the first layer and the second layer laminated thereon was dipped into FES 5000 (sulfuric acid-hydrogen peroxide type etchant, manufactured by Mitsubishi Gas Kagaku) to effect etching at 20° C. for 15 seconds. Here, the etching rate of the Cu layer 103 is markedly more rapid as compared with the etching rate of the Ni layer 102, and therefore only the Cu layer 103 near the hole 106 is etched away, whereby a concavity 107 communicated to the hole 106 of the Cu layer 103 was formed (FIG. 3D).

Figure 3E:
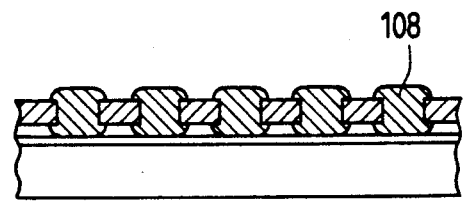
Figure 3F:
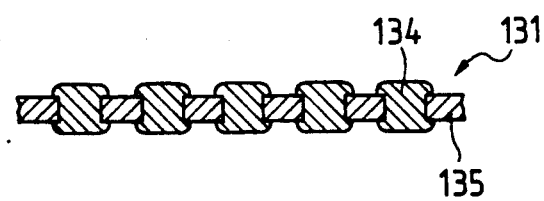

Subsequently, by gold plating by use of the copper foil 101 which becomes the base member as the common electrode, gold 108 internally filled the hole 106 and the concavity 107 (FIG. 3E). During this operation, gold plating was continued until the embedded height became 20 μm. Finally, the two layers 102 and 103 on the base member 101 were removed by metal etching by dipping in a ferric chloride solution at 35° C. for 30 minutes to prepare an electrical connecting member 131 (FIG. 3F).

In this Example, in the electrical connecting member 131 prepared, the electroconductive member 134 is gold and the holding member 135 is a polyimide resin.

Figure 4:
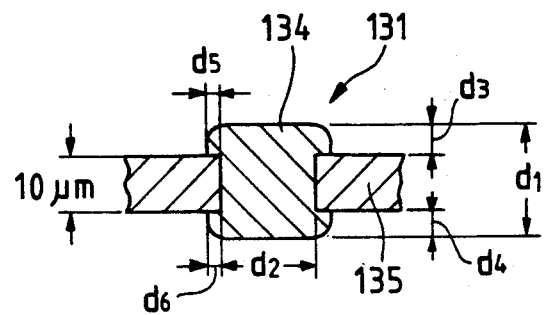
FIG. 4 is a partial enlarged sectional view of the electrical connecting member prepared by the preparation process according to the example in FIGS. 3A to 3F.

FIG. 4 is a partially enlarged view of the electrical connecting member 131 thus prepared, $d_1$ and $d_2$ indicating respectively the height and the diameter of the electroconductive member 134, $d_3$, $d_4$, $d_5$ and $d_6$ indicating respectively the upper protruded height, the lower protruded height, the upper side protruded width and the lower side protruded width of the electroconductive member 134. Among these, the upper protruded height $d_3$ and the lower protruded height $d_4$ are concerned with stability of connection with the electrical circuit part to be connected, and these heights should be desirably 3 μm or more. On the other hand, the upper side protruded width $d_5$ and the lower side protruded width $d_6$ are concerned with the defect prevention of the electroconductive member 134 during handling, and the widths are preferably greater, provided that insulation between the adjoining electroconductive members is maintained. Among these, the upper protruded height $d_3$ and the upper side protruded width $d_5$ are controlled by the time of carrying out gold plating, while the lower protruded height $d_4$ and the lower side protruded width $d_6$ are determined by the shape of the concavity 107 formed by etching.

In this Example, since the second layer (Cu layer 103) is extremely rapid in its etching rate as compared with the first layer (Ni layer 102), the etching depth defining the lower protruded height $d_4$ becomes approximately the same as the thickness of the second layer (Cu layer 103). Therefore, by controlling the thickness of the second layer (Cu layer 103), the lower protruded height $d_4$ of the electroconductive member 134 can be set to the desired value. After progress of etching to the surface of the first layer (Ni layer 102), there was substantially no progress of etching to the depth direction, but only etching progressed in the lateral direction. Therefore, by controlling the etching time, the lower side protruded width $d_6$ of the electroconductive member 134 can be set to the desired value. For the progress of etching in the first layer to be negligible, it is desirable that the etching rate in the second layer should desirably be 10-fold or more as compared with that in the first layer.

EXAMPLE 2

A substrate 104 having a Ni layer 102 with a thickness of 2 μm and a Cu layer 103 with a thickness of 7 μm laminated on a copper foil 101 with a thickness of 70 μm was prepared, and an electrical connecting member 131 was prepared under entirely the same conditions as in Example 1 except for making the etching time for formation of the concavity 107 twenty (20) seconds and the filling height of gold 108 twenty four (24) μm.

EXAMPLE 3

An electrical connecting member 131 was prepared under entirely the same conditions as in Example 2 except for making the etching time for formation of the concavity 107 twenty five (25) seconds.

As Comparative example, a substrate comprising a single layer of copper foil was prepared, and the etching time for formation of the concavity 107 was made 10 seconds, otherwise following the same preparation conditions as in Example 1, to prepare an electrical connecting member.

For the respective electrical connecting members prepared as described above, their cross-sectional shapes were observed by use of a metal microscope. As the result, the upper protruded height $d_3$, the lower protruded height $d_4$, the upper side protruded width $d_5$, the lower protruded width $d_6$ of the electroconductive member 134 were found to be as shown below in Table 1.

TABLE 1

|  | Example 1 | Example 2 | Example 3 | Comparative example |
| --- | --- | --- | --- | --- |
| $d_3$ (μm) | 5–5.5 | 7–8 | 7 | 3–7 |
| $d_4$ (μm) | 4.5–5 | 6–7 | 7 | 3–7 |
| $d_5$ (μm) | 4–6 | 6–8 | 6–8 | 3–7 |
| $d_6$ (μm) | 3–6 | 4–8 | 5–10 | 2–4 |

For each of such electrical connecting members, the surface was observed by use of a metal microscope, and the ratio of falling away of the electroconductive members was examined. Also, the respective electrical connecting members were connected to the probes (one electrical circuit part) and a circuit substrate (the other electrical circuit part) for measurement of electrical resistance, and the resistance of the electroconductive member was measured for judgement of whether the electrical connection was good or not. Further, an electrical circuit member by connecting each electrical connecting member to a semiconductor element (one electrical circuit part) and a circuit substrate (the other electrical circuit part) was encapsulated by use of the injection molding method, and the n the actuation of the IC was confirmed. Further, the actuation of the IC after performing the heat cycle (one cycle comprising cooling at −50° C. for 30 minutes, leaving for 10 minutes, heating at 150° C. for 30 minutes and leaving for 10 minutes) for 100 times was confirmed.

The results of the four kinds of the experiments as described above are shown below in Table 2.

TABLE 2

| | Example 1 | Example 2 | Example 3 | Comparative example |
|---|---|---|---|---|
| Falling of electroconductive members (%) | 0.48 | 0.21 | 0.00 | 12 |
| Defective electrical connection (%) | 0.00 | 0.00 | 0.00 | 4.31 |
| Defective actuation of IC | 0/20 | 0/20 | 0/20 | 1/20 |
| Defective actuation of IC after heat cycle | 0/20 | 0/20 | 0/20 | 0/19 |

As can be understood from Tables 1 and 2, in the present Examples 1 to 3, the lower side protruded width can be made larger, whereby falling away of the electroconductive member from the holding member could be prevented. Also, the upper and lower protruded height could be set to the desired values, and connectability with electrical circuit parts was found to be improved.

EXAMPLE 4

Figure 5A:
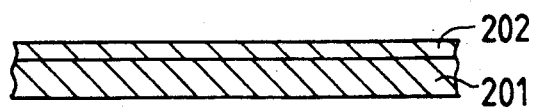
FIGS. 5A through 5G are schematic sectional views showing the steps of the preparation process according to another example of the present invention.
Figure 5B:
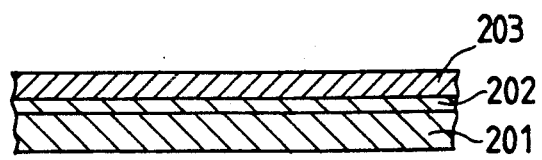

FIGS. 5A-5G are schematic sectional views showing the preparation steps of another example according to the present invention. First, on a copper plate 201 which is the base member an epoxy resin 202 which is the first resin followed by curing (FIG. 5A was coated by a spin coater). Here, since the protruded height of the protruded portion on one side of the electroconductive member at the electrical connecting member to be prepared is limited by the thickness of the epoxy resin 202 which is the first resin, the thickness was set to comply with the desired protruded height. Next, on the epoxy resin 202 a polyimide resin 203 of a nega-type photosensitive resin which is the second resin was coated by for example, a spin coater (FIG. 5B).

Figure 5C:
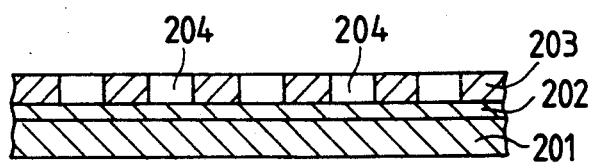
Figure 5D:
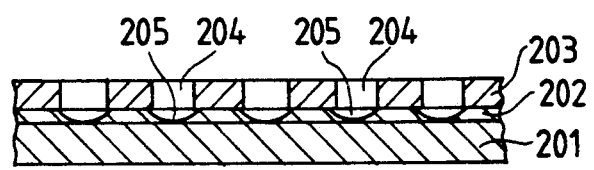

Next, after irradiation (exposure) of light through a photomask forming a predetermined pattern (not shown), developing was carried out. In this Example, the polyimide resin 203 remains at the exposed portion to become a holding member, while the polyimide resin 203 is removed at the portion not irradiated to form a plurality Of holes 204 on the polyimide resin 203 (FIG. 5C). Then, the polyimide resin 203 was cured. Next, one subjected to such treatments was dipped in an etchant which is rapid in etching speed for the epoxy resin but slow for copper and the polyimide resin to effect etching of the epoxy resin 202. By such etching, a part of the epoxy resin 202 near the hole 204 was etched away to form a concavity communicated to the hole 204 on the epoxy resin 202 (FIG. 5D). In this case, the diameter of the concavity 205 formed is made larger than the diameter of the hole 204 but smaller than half of the distance to the outer peripheral of the adjoining hole 204. Thus, by controlling the size of the concavity 205, an electrical connecting member could be prepared without conduction mutually between the adjoining electroconductive members and yet without falling away of the electroconductive member.

Figure 5E:
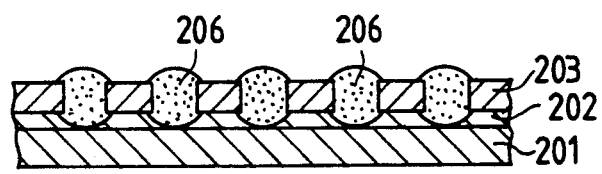
Figure 5F:
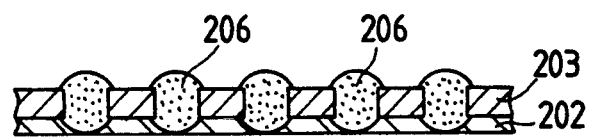
Figure 5G:
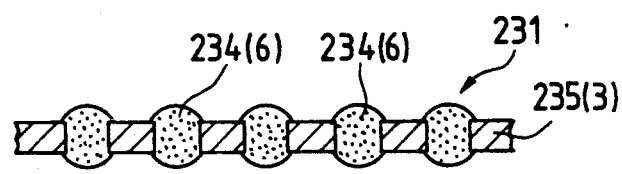

Next, by gold plating by use of the copper plate 201 which is the base member as the common electrode, gold 206 which is the electroconductive material was filled in the hole 204 and the concavity 205, and gold plating was continued until the gold 206 was protruded from the surface of the polyimide resin 203 (FIG. 5E). By use of an etchant which can etch copper but not gold and the polyimide resin, the copper plate 201 was removed by metal etching (FIG. 5F), and then by use of a solvent which can dissolve the epoxy resin but not the polyimide resin, the epoxy resin 202 was removed to prepare an electrical connecting member 231 (FIG. 5G).

In such electrical connecting member 231, the gold 206 constitutes the electroconductive member 234, and the polyimide resin 203 constitutes the holding member 235.

In the above Example, since the concavity 205 which becomes shaped in the projected portion of the electroconductive member 234 is formed in a resin (epoxy resin), as compared with the prior art example in which the concavity is formed in a metallic base member, the shape of the concavity to be formed can be readily controlled.

In Example 4 as described above, an epoxy resin 202 was employed as the first resin, but this is not limitative, but resists in general such as OMR series of Tokyo Oka can be also employed. The first resin may be either photosensitive or non-photosensitive.

As the second resin which is the holding member, a polyimide resin 203 was employed, but otherwise epoxy resins, silicone resins, etc. may be also employed, provided that they are photosensitive resins. Also, one or plural kinds of inorganic materials, metallic materials, alloy materials shaped in a desired form such as powder, fiber, plate, bar, sphere, etc, may be also dispersed to be contained in such resins. Specific examples of metal materials, alloy materials to be contained may include Au, Ag, Cu, Al, Be, Ca, Mg, Mo, Fe, Ni, Co, Mn, W, Cr, Nb, Zr, Ti, Ta, Zn, Sn, Pb-Sn, etc., and inorganic materials may include ceramics such as $SiO_2$, $B_2O_3$, $Al_2O_3$, $Na_2O$, $K_2O$, CaO, ZnO, BaO, PbO, $Sb_2O_3$, $AS_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon boron, etc.

In this Example, the electroconductive member 234 was formed by filling of the gold 206 by plating, but another method, for example, selective growth by CVD (chemical vapor deposition) may be also practiced.

The electrical connecting members prepared in this Example may have wiring patterns existing therein. In that case, the wiring pattern may exist internally of the holding member or on one or both surfaces of the holding member. Individual electroconductive members and wiring patterns equipped may be either connected electrically to each other or not. Further, such electrical connection may be done either internally of the holding member, or on one or both of the surfaces of the holding member. The material of the wiring pattern is not limited to metallic materials, but other electroconductive materials may be employed. The end of the connecting portion of the connecting member should be preferably in convex shape. The electrical connecting member may comprise either one layer or a multi-layer of two or more layers.

In this Example, as the electroconductive member 234, gold 206 was employed, but in addition to gold (Au), a metal or alloy such as Cu, Ag, Be, Ca, Mg, Mo, Ni, W, Fe, Ti, In, Ta, Zn, Al, Sn, Pb-Sn, etc. can be employed. The electroconductive member 234 may be formed either of one kind of metals or alloys, or alternatively formed of a mixture of several kinds of metals and alloys. It may be also a material having one or both of organic materials and inorganic materials incorporated in a metallic material. The cross-sectional shape of the electroconductive material 234 can be made round, square and others, but a shape without corner is desirable for avoiding excessive concentration of stress. The electroconductive member 234 is not required to be arranged vertically in the holding member 235, but may be oblique from one surface side of the holding member 235 to the other surface side of the holding member 235. The thickness of the electroconductive member 234 is not particularly limited. The exposed portion of the electroconductive member 234 may be made the same surface as the holding member 235, or protruded from the surface of the holding member 235. However, for effecting contact stability with the connecting portion of an electrical circuit part and to ensure reliability of the connecting portion, the electroconductive member 234 to be connected to the connecting portion of an electrical circuit part should be desirably stably protruded from the holding member 235.

Further, in this Example, a copper plate 201 was used as the base member, but this is not limitative, and it is also possible to use a thin plate of a metal or alloy such as Au, Ag, Be, Ca, Mg, Mo, Ni, W, Fe, Ti, In, Ta, Zn, Al, Sn, Pb-Sn, etc. However, since only the base member is etched away in the final step, it is required that the material of the electroconductive member 234 should be different from the material used for the base member.

EXAMPLE 5

FIGS. 6A–6G are schematic sectional views showing the preparation steps of another Example according to the present invention. First, by use of a copper foil as the base member 301, a polyimide resin was coated as the insulating layer 302 which is the above-mentioned holding member on the base member 301 followed by pre-baking (FIG. 6A). Next, light was irradiated (exposure) on the insulating layer 302 through a photomask having an arrangement pattern of electroconductive members to effect developing. In this Example, by use of a nega-type photomask, the polyimide resin remains after the development at the portion irradiated with light, and the polyimide resin is removed by development of the portion not irradiated with light, whereby a plurality of holes 303 were formed (FIG. 6B). Then, by elevating the temperature, tho polyimide resin was imidated to cure the insulating layer 302. In this way, a part of the base member 301 was exposed by the respective holes 303 of the insulating layer 302.

Next, by application of plating treatment of gold on the exposed base member 301 within the holes 303 of the insulating layer 302 as the electrode, gold which is the electroconductive member 304 is filled within the holes 303, thereby forming bumps 341 protruded to a predetermined height on the surface side of the insulating layer 302 (FIG. 6C). Here, plating was not applied on concavities previously formed by etching, but on the flat surface of the base member 301, and therefore the upper surface of the bump 341 was formed substantially flat.

Next, the base member 301 was removed by etching to have the end of the electroconductive member 304 on the opposite side to the bump 341 exposed on the back side of the insulating layer 302 (FIG. 6D).

Figure 7A:
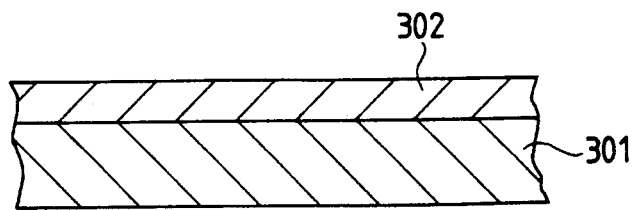
FIGS. 7A through 7G are schematic sectional views showing the steps of the preparation process according to another example of the present invention.
Figure 7B:
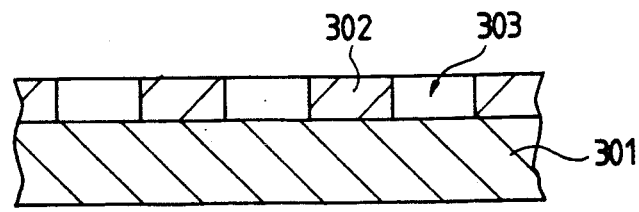
Figures 1, 7C:
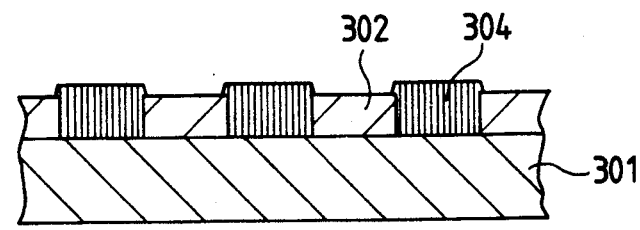
Figures 2, 7C:
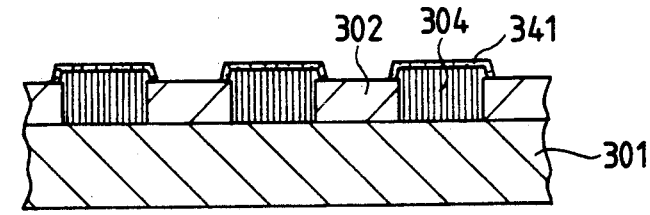
Figure 7D:
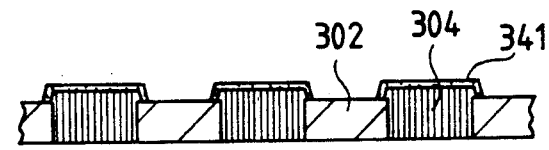
Figures 1, 7E:
Figures 2, 7E:

Next, a common electrode was formed over the respective bumps 341 of the electroconductive member 304. As the formation method, there are, for example, the following two methods. First, one comprising an electroconductive material filled in a gel-like substance such as agar, etc., or an electroconductive liquid is coated on the surface side of the insulating layer 302 and solidified or coagulated, thereby forming the common electrode 305 over the respective bumps 341 (FIG. 6E-1). Also, as shown in FIG. 6E-2, one having a metal coating such as Ni, Al, etc. formed on the surface side of the insulating layer 302 by electroless plating or sputtering vapor deposition the common electrode 306 can be similarly made.

The step E of forming these common electrodes 305 and 306 may be also practiced in the previous step C before removing the base member 301 and thereafter the base member 301 may be removed by etching.

Next, for the bumps 341 having for example the above-mentioned common electrode 306 formed thereon and the insulating layer 302, to the end surface of the electroconductive member 304 exposed on the back surface side of the insulating layer 302, similar plating treatment to that during formation of the electroconductive member 302 and the bump 341 was applied to form bumps 342 by having it protruded from the back surface of the insulating layer 302 to the same protruded height equal to that of the bumps 341 (FIG. 6F). At this time, since plating is applied from the flat end surface of the electroconductive layer 304, the bumps 342 were formed under the same conditions as during formation of the above bumps 341, whereby the bumps 341 and ±he bumps 342 became equal in shape and also in amount expanded on the insulating layer 302.

Next, by removing the common electrode 306 by etching (or dissolving in the case of the common electrode 305 in FIG. 6 E-I, an electrical connecting member 307 having a plurality of electroconductive members 304 equipped at the both ends with the bumps 341 and 342 with the same protruded height, maximum diameter at the bottom and shape was completed.

With such constitution, when electrical circuit parts are connected to each other by use of the electrical connecting member 307 by pressure adhesion or heat pressure adhesion, since the contact areas and the shapes of the bumps 341 and 342 relative to the respective electrical circuit parts are equal on both sides of the insulating layer 302, namely the holding member, the deformed amounts and shapes by pressure adhesion become also equal, whereby uniform connection could be effected between the both ends of the electroconductive member 304 and the respective electroconductive members.

In the method of forming bumps on the back surface side of a holding member by filling a metal by plating in concavities formed by etching on a base member, if it is attempted to form an electroconductive member with a diameter of 15 $\mu$m, the bump shapes and sizes at the both ends of the electroconductive member become nonuniform, and therefore it was necessary for prevention of short circuit between the adjoining bumps to arrange the respective electroconductive members with a pitch of 55 $\mu$m. In the present invention, since the bump shapes and sizes at the both ends are uniform, the pitch can be narrowed to 40 $\mu$m, whereby higher densification has been rendered possible.

EXAMPLE 6

FIGS. 7A-7G are schematic sectional views showing the preparation steps of another example according to the present invention. After the photolithographic steps were carried out similarly as in Example 5 (FIGS. 7A and 7B), to the base member 301 exposed internally of the hole 303 of the insulating layer 302, plating treatment of nickel was applied so that the hardness became higher at the central potion than at the bump portion by use of copper which is the base member 301 as the electrode to fill nickel which becomes the electroconductive members 304 into the holes 303 so that it may be slightly protruded from the surface of the insulating layer 302 (FIG. 7C-1). Subsequently, plating treatment of gold which is a metal softer than nickel was applied to form a bump 341 protruded to a predetermined height on the surface side of the insulating layer 302 (FIG. 7C-2).

Figure 7F:
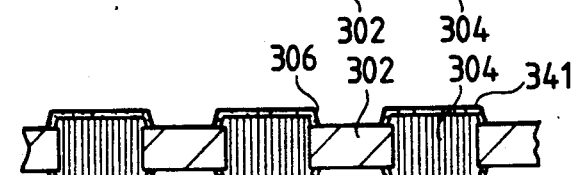
Figure 7G:
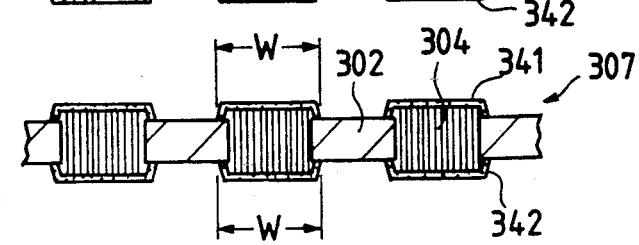

Next, similarly as in Example 5, the base member 301 was etched away to have the ends of the electroconductive member 304 exposed (FIG. 7D), and a common electrode 305 or 306 (FIGS. 7E-1 and 7E-2) was formed. Next, plating treatment was applied in the order of nickel and gold to form bumps 342 protruded from the back surface of the insulating layer 302 to a height equal to the protruded height of the bumps 341 (FIG. 7F). Finally, by removing the common electrode 305 or 306, an electrical connecting member 307 was prepared (FIG. 7G).

EXAMPLE 7

Figure 8A:
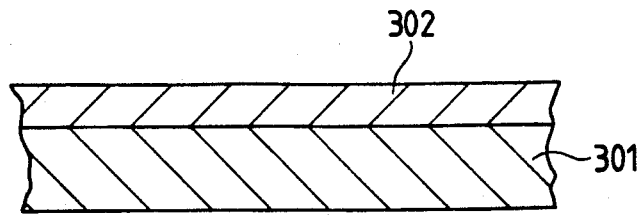
FIGS. 8A through 8G are schematic sectional views showing the steps of the preparation process according to another example of the present invention.
Figure 8B:
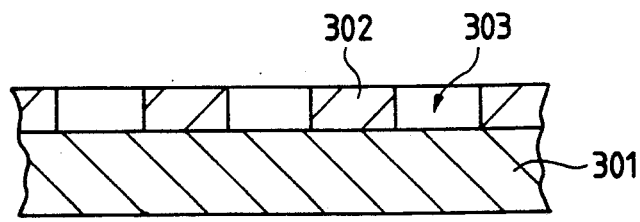
Figures 1, 8C:
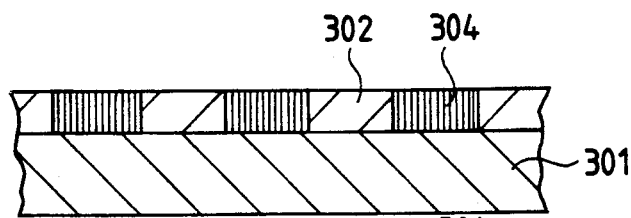
Figures 2, 8C:
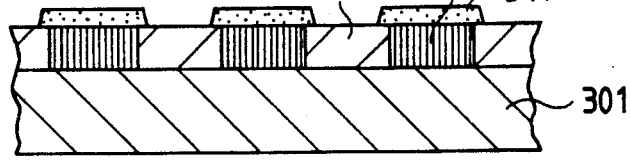
Figure 8D:
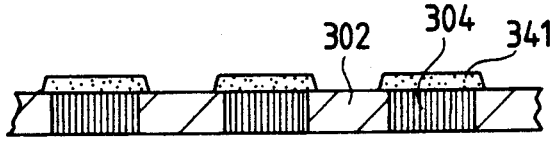

FIGS. 8A-8G are schematic sectional views showing the preparation steps of another example according to the present invention. After the photolithographic steps practiced in the same manner as in Example 5 (FIGS. 8A and 8B), to the base member 301 exposed internally of the holes 303 of the insulating layer 302, plating treatment of nickel was applied so that the hardness became higher at the central portion than at the bump portion by use of copper which is the base member 301 as the electrode to fill nickel which becomes the electroconductive member 304 into the hole 303 so that it may be coplanar with the insulating layer 302 (FIG. 8C-1). Subsequently, plating treatment of gold which is a metal softer than nickel was applied to form a bump 341 protruded to a predetermined height on the surface side of the insulating layer 302 (FIG. 8C-2).

Figures 1, 8E:
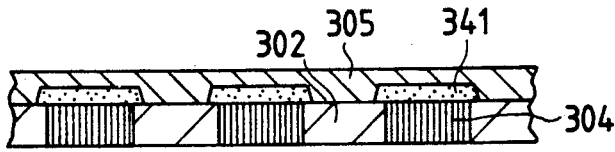
Figures 2, 8E:
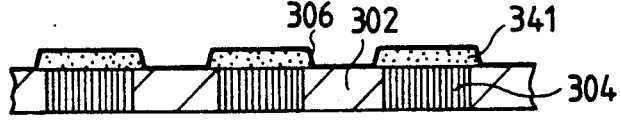
Figure 8F:
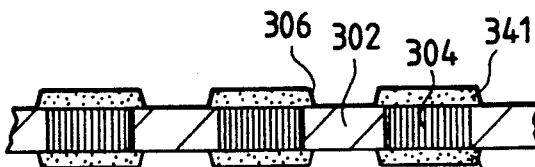
Figure 8G:
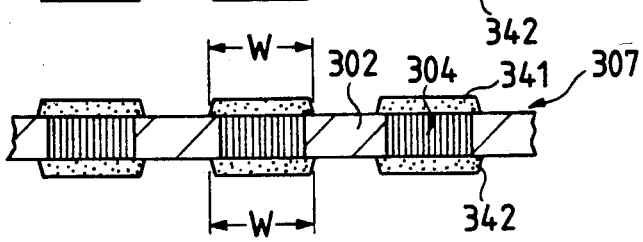

Next, similarly as in Example 5 the base member 301 was etched away to have the ends of the electroconductive member 304 exposed (FIG. 8D), thereby forming a common electrode 305 or 306 (FIGS. 8E-1 and 8E-2). Next, gold plating treatment was applied to form bumps 842 protruded from the back surface Of the insulating layer 302 to a height equal to the protruded height of the bumps 341 (FIG. 8F). Finally, by removing the common electrode 305 or 306, an electrical connecting member 307 was prepared (FIG. 8G).

EXAMPLE 8

FIGS. 9A-9G are schematic sectional views showing the preparation steps of another example according to the present invention. After the photolithographic steps practiced in the same manner as in Example 5 (FIGS. 9A and 9B), to the base member 301 exposed internally of the holes 303 of the insulating layer 302, plating treatment was applied in the order of copper, nickel and copper so that the hardness became higher at the central portion than at the bump portion by use of copper which is the base member 301 as the electrode to fill the metals which become the electroconductive member 304 into the hole 303 so that it may be coplanar with the insulating layer 302 (FIGS. 9C-1 to 9C-3). Subsequently, plating treatment of gold which is a metal softer than copper and nickel was applied to form a bump 341 protruded to a predetermined height on the surface side of the insulating layer 302 (FIG. 9C-4).

Next, similarly as in Example 5, the base member 301 was etched away to have the end of the electroconductive member 304 exposed (FIG. 9D), and a common electrode 305 or 306 (FIGS. 9E-1 and 9E-2) was formed. Next, gold plating treatment was applied to form bumps 342 protruded from the back surface of the insulating layer 302 to a height equal to the protruded height of the bumps 341 (FIG. 9F). Finally, by removing the common electrode 305 or 306, an electrical connecting member 307 was prepared (FIG. 9G).

EXAMPLE 9

FIGS. 10A-10G are schematic sectional views showing the preparation steps of another example according to the present invention. After the photolithographic steps practiced in the same manner as in Example 5 (FIGS. 10A and 10B), on the base member 301 exposed internally of the hole 303 of the insulating layer 302, plating treatment of gold was applied to fill gold to a shape with the central portion raised up in the hole 303 by use of copper which is the base member 301 as the electrode (FIG. 10C-1). By making the flow speed of the plating solution more rapid, gold could be filled to such a shape. Subsequently, plating treatment of nickel was applied to fill nickel to a shape with the central portion recessed on the gold (FIG. 10C-2). Nickel could be filled to such a shape by using a plating bath of a conventional dipping type, thereby making the flow speed of the plating solution substantially zero. Subsequently, plating treatment of gold was applied to form bumps 341 protruded to a predetermined height on the surface side of the insulating layer 302 (FIG. 10C-3).

Next, similarly as in Example 5, the base member 301 was etched away to have the end of the electroconductive member 304 exposed (FIG. 10D), a common electrode 305 or 306 (FIGS. 10E-1 and 10E-2) was formed. Next, gold plating treatment was applied to form bumps 342 protruded from the back surface of the insulating layer 302 to a height equal to the protruded height of the bumps 341 (FIG. 10F). Finally, by removing the common electrode 305 or 306, an electrical connecting member 307 was prepared (FIG. 10G).

EXAMPLE 10

FIGS. 11A-11G are schematic sectional views showing the preparation steps of another example according to the present invention. After the photolithographic steps practiced in the same manner as in Example 5 (FIGS. 11A and 11B), on the base member 301 exposed internally of the hole 303 of the insulating layer 302, plating treatment of gold was applied by use of copper which is the base member 301 as the electrode to fill gold to form bumps 341 protruded to a predetermined height on the surface side of the insulating layer 302 (FIG. 11C). During this operation, the plating conditions during formation of the portion embedded within the insulating layer 302 and the bumps 341 were varied so that the plating bath temperature and/or the current density during formation of the bumps 341 were smaller than the plating bath temperature and/or the current density during formation of the portion embedded within the insulating layer 302. By doing so, the bumps 341 became softer than the portions embedded within the insulating layer 302.

Next, similarly as in Example 5, the base member 301 was etched away to have the end of the electroconductive member 304 exposed (FIG. 11D), a common electrode 305 or 306 (FIGS. 11E-1 and 11E-2) was formed. Next, gold plating treatment was applied under the same plating conditions as in formation of the bumps 341 to form bumps 342 protruded from the back surface of the insulating layer 302 to a height equal to the protruded height of the bump 341 (FIG. 11F). Finally, by removing the common electrode 305 or 306, an electrical connecting member 307 was prepared (FIG. 11G).

According to the examples 6 to 10 as described above, electrical connecting members with the portion embedded within the insulating layer 302 having greater hardness than the bumps 341, 342 could be prepared. When the electroconductive member 304 with such constitutions were pressure adhered or thermally pressure adhered to the connecting portion of an electrical circuit part, the bump could be deformed in favorable manner to effect bonding of the electroconductive member to the connecting portion of the electrical circuit part under low load.

In Examples 5 to 10 as described above, gold, nickel, copper, etc. are used as the electroconductive member 304, but this is merely an example, and other electroconductive materials may also be used as a matter of course.

In the Examples as described above, copper foil was employed for the base member 301, but it is not limited to metal materials, but may be one which can constitute the electrode during plating of the electroconductive material 304. For example, one having an electroconductive material coated on a glass plate can be also used, and an insulating layer may be formed by lamination on the coated surface.

EXAMPLE 11

Figure 12A:
FIGS. 12A through 12J are schematic sectional views showing the steps of the preparation process according to another example of the present invention.
Figure 12B:
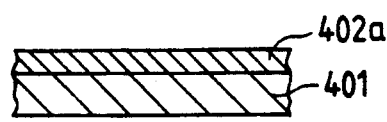
Figure 12C:
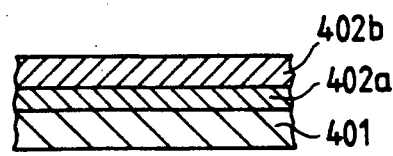
Figure 12D:
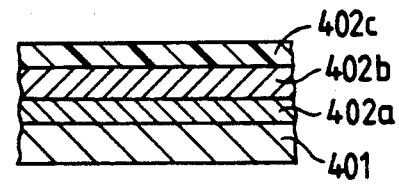

FIGS. 12A-12J are schematic sectional views showing the preparation steps of another example according to the present invention. First, a copper plate 401 which is the base member was provided (FIG. 12A), and on the copper plate 401 was coated a first photosensitive resin 402a (hereinafter referred to as first resin 402a), followed by pre-baking (FIG. 12B). Here, since the protruded height of the protruded portion to be formed on one side of the electroconductive member in the electrical connecting member is determined by the thickness of the first resin 402a, the thickness was set to comply with the desired protruded height. Next, on the first resin 402a was coated a second photosensitive resin 402b which becomes the holding member (hereinafter referred to as second resin 402b) having a photosensitive wavelength band different from that of the first resin 402a, followed by pre-baking (FIG. 12C). Here, since the thickness of the holding member in the electrical connecting member to be prepared is determined by the thickness of the second resin 402b, the thickness was set so as to comply with the thickness of the desired thickness of the holding member. Further, on the second resin 402b was coated a third photosensitive resin 402c (hereinafter referred to as third resin 402c) having a photosensitive wavelength band different from that of the first resin 402a and that of the second resin 402b, followed by pre-baking (FIG. 12D). Here, since the protruded height of the protruded portion on the other side of the electroconductive member in the electrical connecting member to be prepared is determined by the thickness of the third resin 402c, the thickness was set so as to comply with the desired protruded height. For the first resin 402a and the third resin 402c, epoxy resins, general resists (for example, Tokyo Oka OMR series), etc. can be employed, and for the second resin 402b, polyimide resins (for example, CIBA-GEIGY, Provyimide 412), etc. can be employed.

Figure 15:
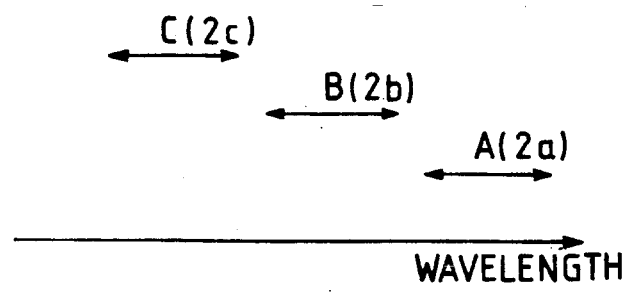
FIG. 15 are schematic diagrams showing the respective photosensitive wavelength bands of the photosensitive resins used in the examples shown in FIGS. 12A–12J, 13A–13J and 14A–14L.

FIG. 15 is a graph showing the photosensitive wavelength bands of these three kinds of resins, the axis of abscissa showing wavelength. In FIG. 15, A, B and C show respectively the photosensitive wavelength bands for the first resin 402a, the second resin 2b and the third resin 2c, and the photosensitive wavelength regions Of the respective resins are different without overlapping with each other to the extent that there is no influence on exposure.

Figure 12E:
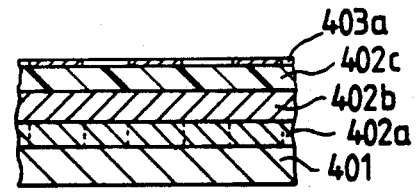
Figure 12F:
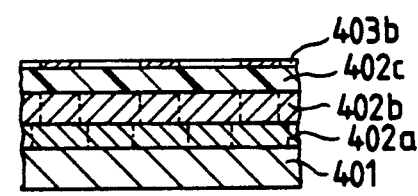
Figure 12G:
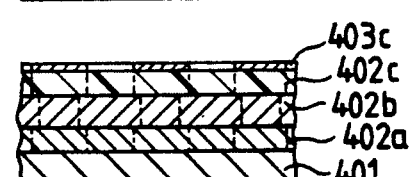

Next, through a photomask 403a for forming a predetermined pattern, exposure was effected by irradiation of the light in the region A in FIG. 15 (FIG. 12E). During this operation, since the light with the wavelength capable of exposing the first resin 402a is irradiated, only the first resin 402a is exposed to the predetermined pattern, with the second resin 402b and the third resins 402c not exposed and therefore without influence. Since the area of the protruded portion on one side of the electroconductive member in the electrical connecting member to be prepared is limited by the pattern of the photomask 403a, the pattern was set so as to comply with the desired area. Next, through a photomask 403b for forming another predetermined pattern, exposure was effected by irradiation of the light in the region B in FIG. 15 (FIG. 12F). During this operation, since the light with the wavelength band for exposure of the second resin 402b is irradiated, only the second resin 402b is exposed to the predetermined pattern, with the third resin 402c being not exposed and therefore without influence, and the exposed pattern of the first resin 402a already formed is also subject to no influence. The diameter of the electroconductive member in the electrical connecting member to be prepared is limited by the pattern of the photomask 403b, and therefore the pattern was set so as to comply with the desired diameter. Further, through a photomask 403c for forming another predetermined pattern, exposure was effected by irradiation of the light in the region C in FIG. 15 (FIG. 12G). During this operation, since the light with the wavelength band for exposure of the third resin 402c is irradiated, only the third resin 402c is exposed to the predetermined pattern, and the exposed patterns of the first resin 402a and the second resin 402b are subject to no influence. Since the area of the protruded side on the other side of the electroconductive member in the electrical connecting member to be prepared is limited by the pattern of the photomask 403c, the pattern was set so as to comply with the desired area.

Figure 12H:
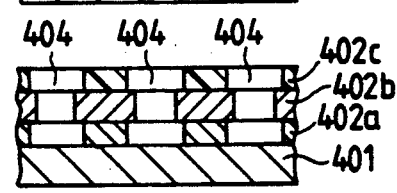
Figure 12I:
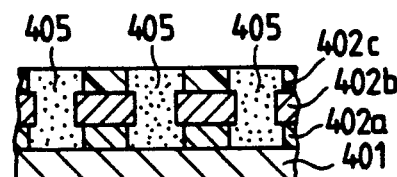
Figure 12J:
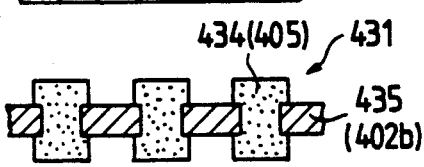

After such exposures as described above, developing was carried out. In this Example, since nega-type photosensitive resins are employed in all of the first, the second and the third resins, the respective resins 402a, 402b and 402c remain at the exposed portions, while the respective resins 402a, 402b and 402c are removed at the unexposed portions, whereby a plurality of holes 404 were formed on the laminated body (FIG. 12H). Then, the respective resins 402a, 402b and 402c were cured. Next, by gold plating by use of a copper plate 401 as the common electrode, the hole 404 is filled with the gold 405, and gold plating was continued until the surface becomes coplanar with that of the third resin 402c (FIG. 12I). Finally, the copper plate 401 was etched away and also the first resin 402a and the third resin 402c were dissolved away to prepare an electrical connecting member 431 (FIG. 12J).

In the thus prepared electrical connecting member 431, the gold 405 constitutes the electroconductive member 434, and the second resin 402b constitutes the holding member 435. In this Example, since exposure and developing processings were carried out continuously after continuous lamination of the respective resins, the number of the steps became the smallest. Also, registration of the respective photomasks could be done easily. Further, since developments of the respective resins are carried out at the same time, exposure patterns (removal patterns) of the respective resins can be made as desired, and the diameter of the portion embedded in the holding member and the area at the portion protruded from the holding member could be set as desired in the respective electroconductive members of the electrical connecting member to be prepared. In this Example, three resins with different photosensitive wavelength bands were employed, but the protruded shape in the width direction will be the same if the first photosensitive resin and the third photosensitive resin have substantially the same photosensitive wavelength band. In this case, the masks may be two, the light sources also two, and exposure twice, whereby an electrical connecting member can be easily prepared.

EXAMPLE 12

FIGS. 13A-13J are schematic sectional views showing the preparation steps of another example according to the present invention. In this Example, the first resin 402a, the second resin 402b and the third resin 402c are the same as the respective resins in Example 11 as described above, and the photosensitive wavelength bands are as shown in FIG. 15. Also, the photomasks 403a, 403b, 403c are the same as in Example 11 as described above.

Figure 13A:
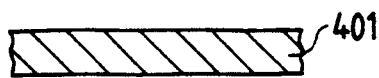
FIGS. 13A through 13J are schematic sectional views showing the steps of the preparation process according to another example of the present invention.
Figure 13B:
Figure 13C:
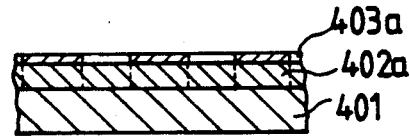
Figure 13D:
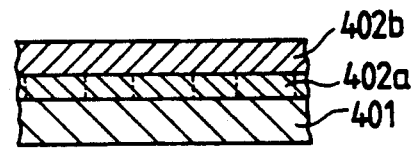
Figure 13E:
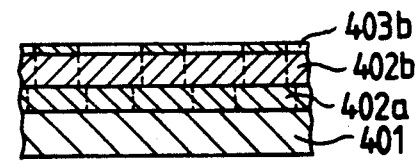
Figure 13F:
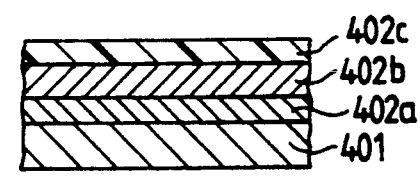
Figure 13G:
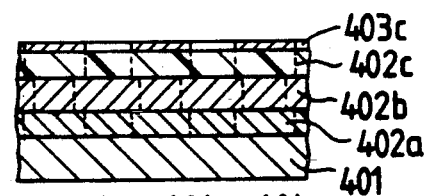

First, a copper plate 401 which is the base member was prepared (FIG. 13A), and on the copper plate 401 was coated the first resin 402a, followed by pre-baking (FIG. 13B). Here, since the protruded height of the protruded portion on one side of the electroconductive member in the electrical connecting member to be prepared is determined by the thickness of the first resin 402a, the thickness was set to comply with the desired protruded height. Next, through the photomask 403a, the light of the region A in FIG. 15 was irradiated to effect exposure (FIG. 13C). Since the area of the protruded side on one side of the electroconductive member in the electrical connecting member to be prepared is limited by the pattern of the photomask 403a, the pattern was set so as to comply with the desired area. Next, on the first resin 402a was coated the second resin 402b, followed by pre-baking (FIG. 13D). Here, since the thickness of the holding member in the electrical connecting member to be prepared is limited by the thickness of the second resin 402b, the thickness was set so as to comply with the thickness of the desired thickness of the holding member. Through the photomask 403b, the light of the region B in FIG. 15 was irradiated to effect exposure (FIG. 13E). During this operation, since the light with the wavelength band for exposure of the second resin 402b is irradiated, only the second resin 402b is exposed to a predetermined pattern, and the exposed pattern of the first resin 402a already formed is subject to no influence. Since the diameter of the electroconductive member in the electrical connecting member to be prepared is limited by the pattern of the photomask 403b, the pattern was set so as to comply with the desired diameter. Further, on the second resin 402b was coated the third resin 402c, followed by pre-baking (FIG. 13F). Here, since the protruded height of the protruded portion on the other side of the electroconductive member in the electrical connecting member to be prepared is determined by the thickness of the third resin 402c, the thickness was set so as to comply with the desired protruded height. Through the photomask 403c, the light of the region C in FIG. 15 was irradiated to effect exposure (FIG. 13G). During operation, since the light with the wavelength band for exposure of the third resin 402c is irradiated, only the third resin 402c is exposed to the predetermined pattern, and the exposed patterns of the first resin 402a and the second resin 402b are subject to no influence. Since the area of the protruded portion on the other side of the electroconductive member in the electrical connecting member to be prepared is limited by the pattern of the photomask 403c, the pattern was set so as to comply with the desired area.

Figure 13H:
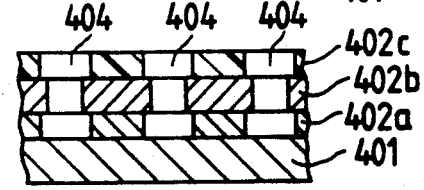
Figure 13I:
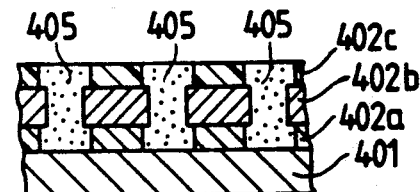
Figure 13J:
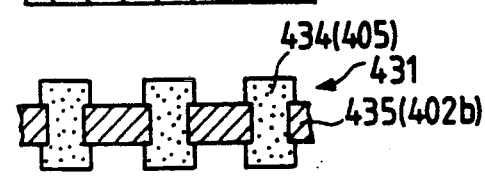

After such exposures as described above, developing was carried out similarly in Example 11 to form a plurality of holes 404 on the laminate of the resin (FIG. 13H). Then, similarly as described in Example 11, the respective resins 402a, 402b and 402c were cured, the holes 404 were filled with the gold 405, and gold plating was continued until the surface became coplanar with that of the third resin 402c (FIG. 13I). Finally, similarly as described in Example 11, the copper plate 401, the first resin 402a and the third resin 402c were removed to prepare an electrical connecting member 431 (FIG. 13J).

In this Example, since developing processings of the respective resins were carried out at the same time, exposure patterns (removal patterns) in the respective resins can be made as desired, and the diameter of the portion embedded in the holding member and the area at the portion protruded from the holding member could be set as desired in the respective electroconductive members of the electrical connecting member to be prepared.

Since exposures were effected by providing individually photomasks on the respective resins to be exposed, unevenness is liable to be formed on the resin, whereby good contact could be obtained between the photomask and the resin. In this Example, three resins with different photosensitive wavelength bands were employed, but if the first photosensitive resin and the third photosensitive resin have substantially the same photosensitive wavelength band, the protruded shape in the width direction will be the same. In this case, the masks may be two, the light sources also two, and exposure twice, whereby an electrical connecting member can be easily prepared.

EXAMPLE 13

FIGS. 14A-14L are schematic sectional views showing the preparation steps of another example according to the present invention. In this Example, the first resin 402a, the second resin 402b and the third resin 402c are the same as the respective resins in Example 11 as described above, and the photosensitive wavelength regions are also as shown in FIG. 15.

Figure 14A:
Figure 14B:
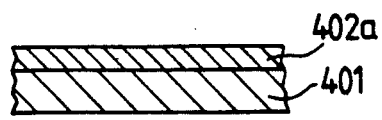
Figure 14C:
Figure 14D:
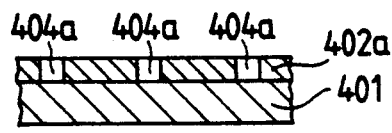
Figure 14E:
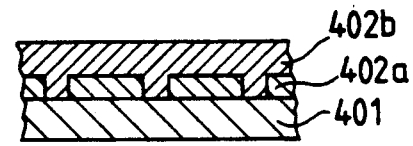
Figure 14F:
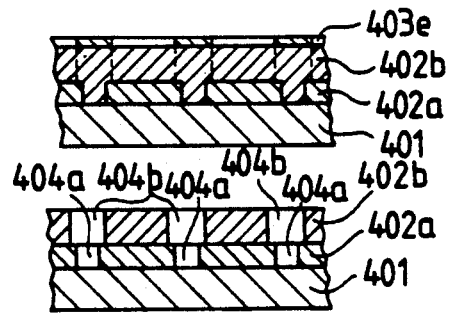
Figure 14G:
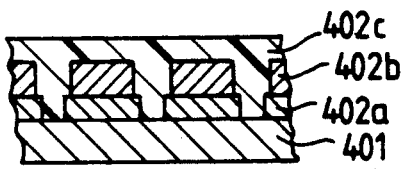
Figure 14H:
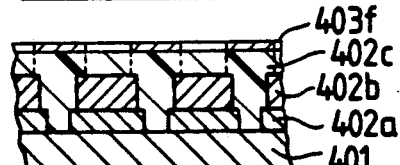
Figure 14I:
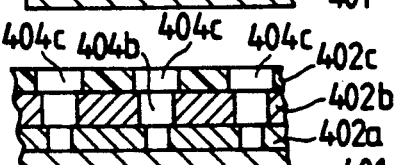
Figure 14J:
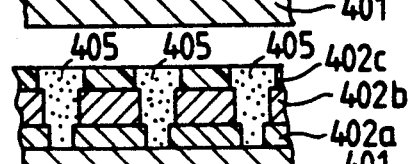

First, a copper plate 401 which is the base member was provided (FIG. 14A), and on the copper plate 401 was coated the first resin 402a, followed by pre-baking (FIG. 14B). Here, since the protruded height of the protruded portion on one side of the electroconductive member in the electrical connecting member to be prepared is determined by the thickness of the first resin 402a, the thickness was set to comply with the desired protruded height. Next, through a photomask 403d for forming a predetermined pattern, the light of the region A in FIG. 15 was irradiated to effect exposure (FIG. 14C). Since the area of the protruded portion on one side of the electroconductive member in the electrical connecting member to be prepared is limited by the pattern of the photomask 403d, the pattern was set so as to comply with the desired area. After exposure, the first resin 402a was developed to form a plurality of holes 404a on the first resin 402a (FIG. 14D). Next, the second resin 402b was coated on the first resin 402a with inclusion of the surface of the exposed copper plate 401, followed by pre-baking (FIG. 14E). Here, since the thickness of the holding member in the electrical connecting member to be prepared is limited by the thickness of the second resin 402b, the thickness was set so as to comply with the thickness of the desired thickness of the holding member. Through a photomask 403e having broader mask pattern than the photomask 403d, the light of the region B in FIG. 15 was irradiated to effect exposure (FIG. 14 F). During this operation, since the light with the wavelength band for exposure of the second resin 402b is irradiated, only the second resin 402b is exposed to a predetermined pattern, and the expose pattern of the first resin 402a already formed is subject to little influence of exposure. Since the diameter of the electroconductive member in the electrical connecting member to be prepared is limited by the pattern of the photomask 403e, the pattern was set so as to comply with the desired diameter. After exposure, the second resin 402b was developed to form a plurality of holes 404b communicated to the holes 404a on the second resin 402b (FIG. 14G). Further, on the second resin 402b was coated the third resin 402c with inclusion of the exposed surface of the copper plate 401, followed by pre-baking (FIG. 14H). Here, since the protruded height of the protruded portion on the other side of the electroconductive member in the electrical connecting member to be prepared is limited by the thickness of the third resin 402c, the thickness was set so as to comply with the desired protruded height. Through a photomask 403f having a broader mask pattern than the photomask 403e, the light of the region C in FIG. 15 was irradiated to effect exposure (FIG. 14I). During this operation, since the light with the wavelength band for exposure of the third resin 402c is irradiated, only the third resin 402c is exposed to the predetermined pattern, and the exposed patterns of the first resin 402a and the second resin 402b are subject to little influence of exposure. Since the area of the protruded portion on the other side of the electroconductive member in the electrical connecting member to be prepared is limited by the pattern of the photomask 403f, the pattern was set so as to comply with the desired area. After exposure, the third resin 402c was developed to form a plurality of holes 404c communicated to the holes 404b on the third resin 402c (FIG. 14J).

After such exposures and developments as described above, similarly as described in Example 11, the respective resins 402a, 402b and 402c were cured, the holes 404a, 404b, 404c filled with the gold 405, and gold plating was continued until the surface became coplanar with that of the third resin 402c (FIG. 14K). Finally, similarly as described in Example 11, the copper plate 401, the first resin 402a and the third resin 402c were removed to prepare an electrical connecting member 431 (FIG. 14L).

Figure 14L:
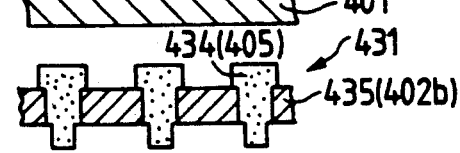

In this Example, since developing processings of the respective resins are carried out successively, exposure patterns (removal patterns) in the respective resins become smaller or equal for the resins on the side nearer to the copper plate 401, and the shapes of the respective portions of the respective electroconductive members in the electrical connecting member to be prepared are limited as shown in FIG. 14L.

Since exposures were effected by providing individually photomasks on the respective resins to be exposed, unevenness is liable to be formed on the resin, whereby good contact could be obtained between the photomask and the resin.

Whereas, in this Example, three resins with different photosensitive wavelength bands were employed, but if the first photosensitive resin and the third photosensitive resin have substantially the same photosensitive wavelength band, the protruded shape in the width direction will be the same. In this case, the masks may be two, the light sources also two, and exposure twice, whereby an electrical connecting member can be easily prepared.

EXAMPLE 14

In the Examples 11 to 13 as described above, three kinds of resins with the photosensitive wavelength bands being not overlapped with one another, or if any, overlapped to the extent without exerting any influence. However, even by use of three kinds of resins with the photosensitive wavelength bands being partially overlapped with one another, if the light with unnecessary wavelength band is shielded by use of an optical filter, an electrical connecting member can be prepared. Such Examples are described below.

Figure 16A:
FIGS. 16A through 16J are schematic sectional views showing the steps of the preparation process according to another example of the present invention.
Figure 16B:
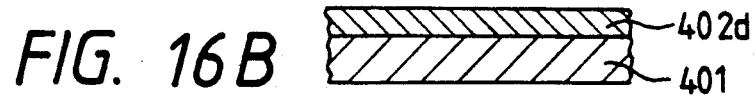
Figure 16C:
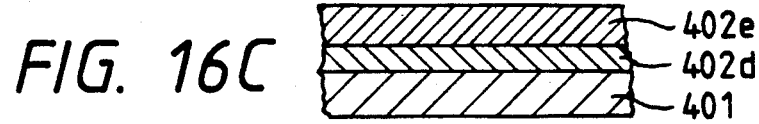
Figure 16D:
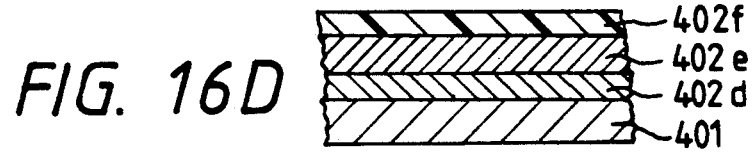

FIGS. 16A-16J are schematic sectional views showing the preparation steps of another example according to the present invention. First, a copper plate 401 which is the base member was prepared (FIG. 16A), and on the copper plate 401 was coated a first photosensitive resin 402d (hereinafter called the first resin 402d), followed by pre-baking (FIG. 16B). Here, since the protruded height of the protruded portion on one side of the electroconductive member in the electrical connecting member to be prepared is limited by the thickness of the first resin 402d, the thickness was set to comply with the desired protruded height. Next, on the first resin 402d was coated a second photosensitive resin 402e which becomes the holding member (hereinafter called the second resin 402e) having a photosensitive wavelength band different from that of the first resin 402d, followed by pre-baking (FIG. 16C). Here, since the thickness of the holding member in the electrical connecting member to be prepared is determined by the thickness of the second resin 402e, the thickness was set so as to comply with the thickness of the desired thickness of the holding member. Further, on the second resin 402e was coated a third photosensitive resin 402f (hereinafter called the third resin 402f) having a photosensitive wavelength band different from those of he first resin 402d and the second resin 402e, followed by pre-baking (FIG. 16D). Here, since the protruded thickness of the protruded portion on the other side of the electroconductive member in the electrical connecting member to be prepared is limited by the thickness of the third resin 402f, the thickness was set so as to comply with the desired protruded height.

Figure 17:
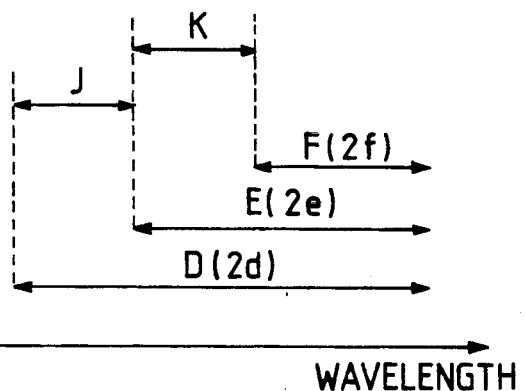
FIG. 17 is a schematic diagram showing the respective photosensitive wavelength bands of the photosensitive resins used in the example shown in FIGS. 16A–16J.

FIG. 17 is a graph showing the photosensitive wavelength bands of these three kinds of resins, the axis of abscissa showing wavelength. In FIG. 17, D, E and F show respectively the photosensitive wavelength bands of the first resin 402d, the second resin 402e and the third resin 402f, and the photosensitive wavelength regions in the respective resins are partially overlapped with one another, with the photosensitive wavelength band of the first resin 402d being the broadest, and the photosensitive wavelength band in the third resin 402f the narrowest.

Figure 16E:
Figure 16F:
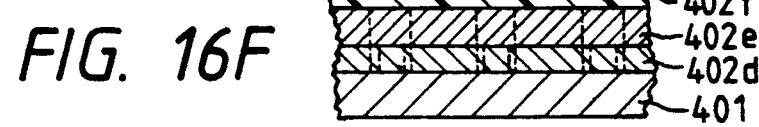
Figure 16G:
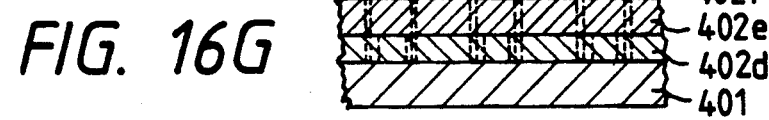

Next, through a photomask 403g for forming a predetermined pattern, exposure was effected by irradiation of a light (FIG. 16E). Here, as the irradiation light, a light transmitted through an optical filter (not shown) was employed, and the light with the wavelength band shown by in FIG. 17 was irradiated. Then, only the first resin 402d was exposed to a predetermined pattern, while the second resin 402e and the third resin 402f were little influenced by the exposure. Since the area of the protruded portion on one side of the electroconductive member in the electrical connecting member to be prepared is limited by the pattern of the photomask 403g, the pattern was set so as to comply with the desired area. Next, through a photomask 403h having a broader mask pattern than the photomask 403g, exposure was effected by irradiation of a light (FIG. 16F). Here, as the irradiation light, a light transmitted through an optical filter (not shown) was employed, and the light with the wavelength band shown by K in FIG. 17 was irradiated. By doing so, the third resin 402f is little influenced by the exposure. On the other hand, while the first resin 402d is exposed, the exposure region at this time is included in the region previously exposed. Hence, the exposed pattern of the first resin 402d is not influenced by the second exposure at all. The diameter of the electroconductive member in the electrical connecting member to be prepared is limited by the pattern of the photomask 403h, and therefore the pattern was set so as to comply with the desired diameter. Further, through a photomask 403i for forming a broader mask pattern than the photomask 403h, exposure was effected by irradiation of the light in the region F in FIG. 17 (FIG. 16G). During this operation, while the first resin 402d and the second resin 402e are exposed, the exposure region at this time is included within the region previously exposed, and therefore the respective exposed patterns of the first resin 402d and the second resin 402e already formed are not influenced by the third exposure. Since the area of the protruded portion on the other side of the electroconductive member in the electrical connecting member to be prepared is limited by the pattern of the photomask 403i, the pattern was set so as to comply with the desired area.

Figure 16H:
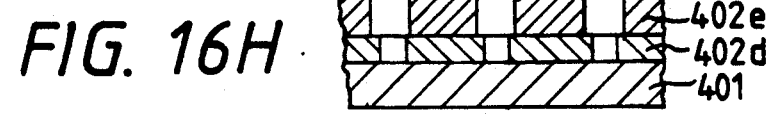
Figure 16:
Figure 16J:
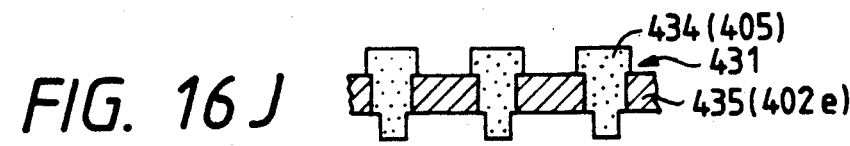

After such exposures as described above, developing was carried out. In this Example, the respective resins 402d, 402e and 402f remain at the exposed portions, while the respective resins 402d, 402e and 402f are removed at the unexposed portions, whereby a plurality of holes 404 were formed on the laminate (FIG. 16H). Then, the respective resins 402d, 402e end 402f were cured. Next, by gold plating by use of a copper plate 401 as the common electrode, the holes 404 were filled with the gold 405, and gold plating was continued until the surface became coplanar with that of the third resin 402f (FIG. 16I). Finally, the copper plate 401 was etched away and also the first resin 402d and third resin 402f were dissolved away to prepare an electrical connecting member 431 (FIG. 16J).

In this Example, exposures were effected continuously after continuous lamination of the respective resins, and registration of the respective photomasks could be easily done.

EXAMPLE 15

Figure 19:
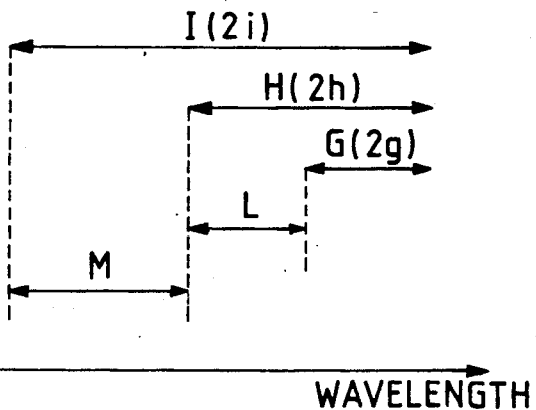
FIG. 19 is a schematic diagram showing the respective photosensitive wavelength bands of the photosensitive resins used in the example shown in FIGS. 18A–18J.

FIGS. 18A-18J are schematic sectional views showing the preparation steps of another example according to the present invention. The first resin 402g, the second resin 402h and the third resin 402i in this Example are also overlapped partially in their respective photosensitive wavelength regions with one another similarly in Example 14. FIG. 19 is a graph showing the photosensitive wavelength bands of these three kinds of resins, the axis of abscissa showing wavelength. In FIG. 19, G, H and I show respectively the photosensitive wavelength bands in the first resin 402g, the second resin 402h and the third resin 402i, with the photosensitive wavelength band in the first resin 402g being the narrowest and the photosensitive wavelength band in the third resin 402i the broadest.

Figure 18A:
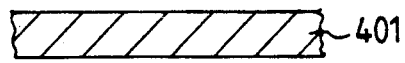
FIGS. 18A through 18J are schematic sectional views showing the steps of the preparation process according to another example of the present invention.
Figure 18B:
Figure 18C:
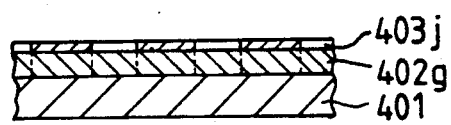
Figure 18D:
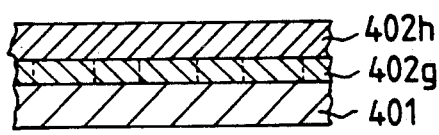
Figure 18E:
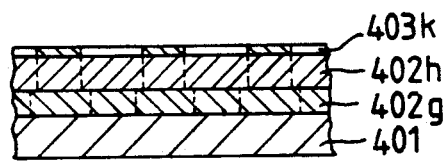
Figure 18F:
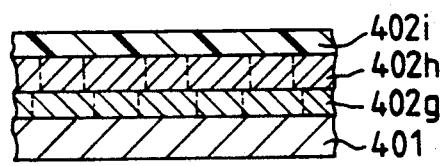
Figure 18G:
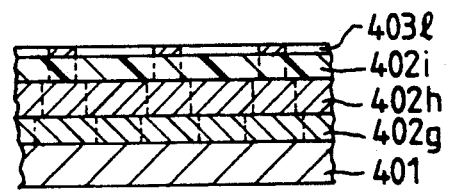

First, a copper plate 401 which is the base member was prepared (FIG. 18A), and on the copper plate 401 was coated the first resin 402g, followed by pre-baking (FIG. 18B). Here, since the protruded height of the protruded portion on one side of the electroconductive member in the electrical connecting member to be prepared is limited by the thickness of the first resin 402g, the thickness was set to comply with the desired protruded height. Through a photomask 403j for forming a predetermined pattern, the light in the region G in FIG. 19 was irradiated to effect exposure (FIG. 18C). Since the area on one side of the protruded portion of the electroconductive member in the electrical connecting member to be prepared is limited by the pattern of the photomask 403j, the pattern was set so as to comply with the desired area. Next, on the first resin 402g was coated the second resin 402h, followed by pre-baking (FIG. 18D). Here, since the thickness of the holding member in the electrical connecting member to be prepared is limited by the thickness of the second resin 402h, the thickness was set so as to comply with the thickness of the desired thickness of the holding member. Through a photomask 403k having a narrower mask pattern than the photomask 403j, a light was irradiated to effect exposure (FIG. 18E). Here, as the irradiation light, a light transmitted through an optical filter (not shown) was employed, and the light with the wavelength band shown by L in FIG. 19 was irradiated. Then, only the second resin 402h was exposed to a predetermined pattern, and the first resin 402g not. Since, the diameter of the electroconductive member in the electrical connecting member to be prepared is limited by the pattern of the photomask 403k, the pattern was set so as to comply with the desired diameter. Further, on the second resin 402h was coated a third photosensitive resin 402i, followed by pre-baking (FIG. 18F). Here, since the protruded height of the protruded portion on the other side of the electroconductive member in the electrical connecting member to be prepared is limited by the thickness of the third resin 402i, the thickness was set so as to comply with the desired protruded height. Through a photomask 403l having a narrower mask pattern than the photomask 403k, exposure was effected by irradiation of a light (FIG. 18G). Here, as the irradiation light, a light transmitted through an optical filter (not shown) was employed, and the light with the wavelength band shown by M in FIG. 19 was irradiated. Then only the third resin 402i was exposed to a desired pattern, while the first resin 402g and the second resin 402h were not exposed. The area of the protruded portion on the other side of the electroconductive member in the electrical connecting member to be prepared is limited by the pattern of the photomask 403l, and therefore the pattern was set so as to comply with the desired area.

Figure 18H:
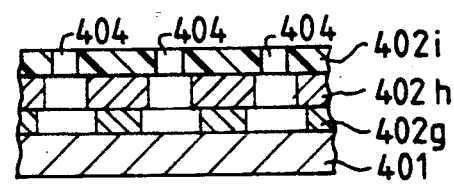
Figure 18I:
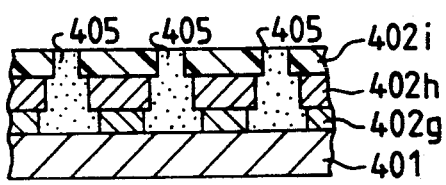
Figure 18J:
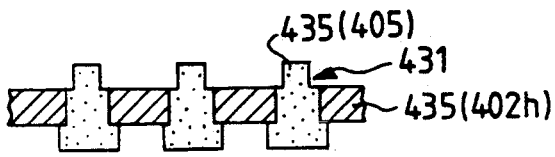

After such exposures as described above, developing was carried out in the same manner in Example 14 to form a plurality of holes 404 on the laminate of the resin (FIG. 18H). Then, similarly as described in Example 14, the respective resins 402g, 402h, 402i were cured, gold 405 was filled in the holes 404 by gold plating, and gold plating was continued until forming a surface coplanar with the surface of the third resin 402i (FIG. 18I). Finally, the copper plate 401, the first resin 402g and the third resin 402i were removed to prepare an electrical connecting member 431, with the upper and lower portions being opposite to those in Example 14 (FIG. 18J).

In this Example, exposures were effected by providing individually photomasks on the respective resins to be exposed, whereby good contact between the photomask and the resin could be obtained.

In this Example, resins with different photosensitive wavelength bands were employed, but, for example, eve those with portions excluding the peak and half-value wavelength being more or less overlapped with one another, provided that the influence of curing by the light is little, they will be useable as a matter of course.

In Examples 11 to 15 as described above, the first resin and the third resin were each made a single constitution, but the first resin and/or the third resin may be also made a multi-layer constitution as a matter of course, and by making these constitutions multiple layers, the portion protruded from the holding member in each electroconductive member can be set in shape with a stepped difference.

In the first, the second and the third resins, one or plural kinds of inorganic materials, metal materials, alloy materials shaped in desired shapes such as powder, fiber, plate, bar, sphere, etc. may be also contained dispersed therein. Specific examples of metal materials, alloy materials may include Au, Ag, Cu, Al, Be, Ca, Mg, Mo, Fe, Ni, Co, Mn, W, Cr, Nb, Zr, Ti, Ta, Zn, Sn, Pb-Sn, etc., while as the inorganic laterials to be contained, there may be included ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

The electroconductive member 434 was formed by filling gold 405 by plating, but this may also be performed by another method, for example, selective growth according to CVD (chemical vapor deposition).

In some of the electrical connecting members prepared by the present invention, wiring pattern exists. In that case, the wiring pattern may exist internally of the holding member, or alternatively on one or both surfaces of the holding member. The individual electroconductive members and the wiring pattern may be electrically connected or not. Further, such electrical connection may be done internally of the holding member, or alternatively on one or both surfaces of the holding member. The material of the wiring pattern is not limited to metal materials, but other electroconductive materials may be employed. It is preferable that the end of the connecting portion of the electroconductive member should be in convex shape. Also, the electrical connecting member may comprise one layer or a multiple layers of two or more layers.

In this Example, gold 405 was employed as the material for the electroconductive member 434, but other than gold (Au), metals or alloys of Cu, Ag, Be, Ca, Mg, Mo, Ni, W, Fe, Ti, In, Ta, Zn, Al, Sn, Pb-Sn, etc. can be used. The electroconductive member 34 may be formed of one kind of metals and alloys, or alternatively of a mixture of several kinds of metals and alloys. Also, it may be a material comprising one or both of organic materials or inorganic materials incorporated in a metal material. The cross-sectional shape of the electroconductive member 434 can be made round, square or other shapes, but it is desirable that a shape having no corner is desirable for avoiding excessive concentration of stress. The electroconductive member 434 is not required to be arranged vertically in the holding member 435, but may be also oblique from one surface side of the holding member 435 to the other surface side of the holding member 435. The thickness of the electroconductive member 434 is also not particularly limited. The exposed portion of the electroconductive member 434 may be made the same surface as the holding member 435, or protruded from the surface of the holding member 435. However, for effecting contact stability with the connecting portion of an electrical circuit part to ensure reliability of the connecting portion, the electroconductive member 434 to be connected to the connecting portion of an electrical circuit part should be desirably protruded stably from the holding member 435.

Further, in this Example, a copper plate 401 was used as the base member, but this is not limitative, and it is also possible to use a thin plate of a metal or alloy such as Au, Ag, Be, Ca, Mg, Mo, Ni, W, Fe, Ti, In, Ta, Zn, Al, Sn, Pb-Sn, etc. However, since only the base member is etched away in the final step, it is required that the material of the electroconductive member 434 should be different from the material used for the base member.

EXAMPLE 16

Figure 20A:
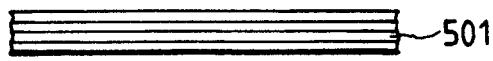
FIGS. 20A through 20K are schematic sectional views showing the steps of the preparation process according to another example of the present invention.
Figure 20B:
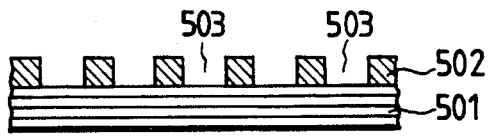

FIGS. 20A–20K are schematic sectional views showing the principal steps of another example according to the present invention. First as the base member, a copper plate 501 having a tungsten (W) film formed by lamination on the surface was prepared (FIG. 20A), and a resist 502 was coated onto the copper plate 501, followed by pre-baking. Next, exposure and developing were carried out to form holes 503 with W film on the surface of the copper plate 501 exposed at the bottom, followed by hard baking of the resist 502 (FIG. 20B).

Figure 20C:
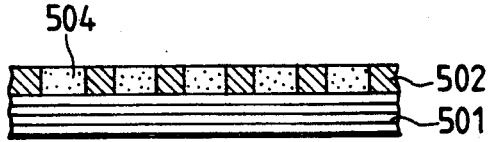
Figure 20D:
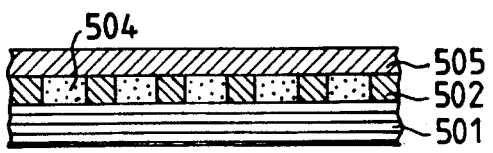
Figure 20E:
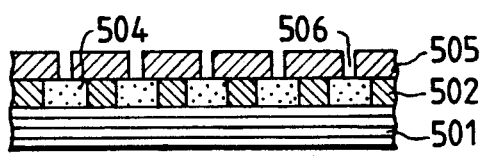

With the copper plate 501 as the electrode, gold which is en electroconductive material was filled into the respective holes 503, and gold plating was applied until the surface of the gold 504 became coplanar with the surface of the resist 502 (FIG. 20C). Next, a photosensitive resin constituting the insulating holding member over the surface of the resist 502 and the surface of the gold 504, for example, a polyimide resin 505 was coated to a uniform thickness, followed by pre-baking (FIG. 20D). The photosensitive resin 505 was subjected to exposure and developing, to form holes 506 at approximately the central portion at the position corresponding to the gold 504 having smaller diameter than that of the gold 504 with the surface of the above-mentioned gold 504 exposed at the bottom (FIG. 20E), followed by postbaking to cure the photosensitive resin 505.

Figure 20F:
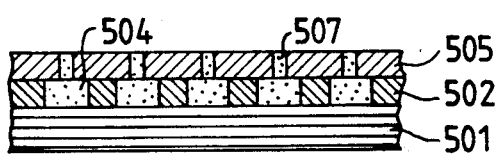
Figure 20G:
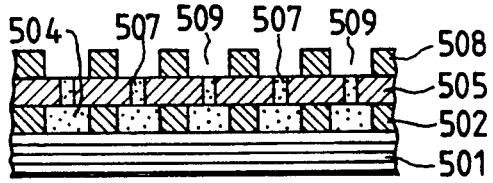
Figure 20H:
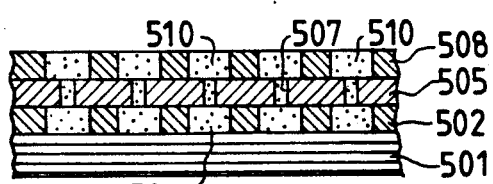
Figure 20I:
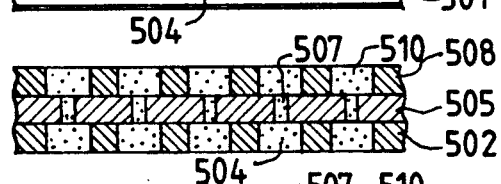

Next, by use f the gold 504 on the copper plate 501 as the electrode, gold 507 was filled into the respective holes 506, and also the gold plating was applied until the surface of the gold 507 became coplanar with the surface of the photosensitive resin 505 (FIG. 20F). Again, the resist 508 was coated uniformly over the surface of the photosensitive resin 505 and the surface of the gold 507, and after prebaking, exposure and developing were carried out. At the position corresponding to the above-mentioned gold 507, holes 509 having a size approximate to the diameter of the gold 504 and having the gold 507 and a part the photosensitive resin 505 exposed at the bottom were formed (FIG. 20G). Next, with the gold 504 and the gold 507 on the copper plate 501 as the electrode, gold plating was applied until the gold 510 was filled into the respective holes 509, and the surface of the gold 510 became coplanar with the surface of the resist 508 (FIG. 20H).

Figure 20J:
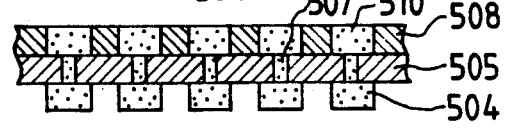
Figure 20K:
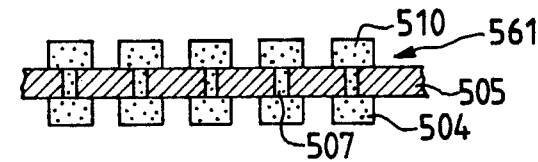

Then, first the copper plate 501 was selectively etched to remove this (FIG. 20I), and then the resist 502 subjected to hard baking was removed by ashing by use of O₂ plasma (FIG. 20J). Further, the resist 508 was removed by use of a resist peeling liquid (FIG. 20K); to prepare an electrical connecting member in which the golds 504, 507 and 510 constitute the electroconductive material and the photosensitive resin 505 constitutes the holding member. The order of these removing steps may be artitrary. For example, first the resist 508 may be removed by use of a resist peeling liquid, and thereafter the copper plate 501 may be etched, or alternatively the resist 502 may be also removed by ashing by use of O₂ plasma.

By this Example, the bump is regulated in its expansion in the lateral direction by the holes 503 and 509 perforated through the resist 502 and 508, whereby inconveniences of mutual contact between adjoining bumps can be prevented, and also it has been rendered possible to set the protruded heights of the bumps as desired by suitably setting the thicknesses of the resists 502 and 508.

EXAMPLE 17

In this Example, the constitution is made to have a metal layer each between the resist and the photosensitive polyimide resin. FIGS. 21A–21I are schematic sectional views showing the principal steps of another example according to the present invention.

Figure 21A:
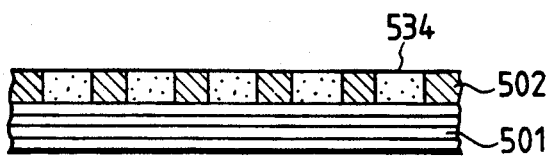
FIGS. 21A through 21I are schematic sectional views showing the steps of the preparation process according to another example of the present invention.
Figure 21B:
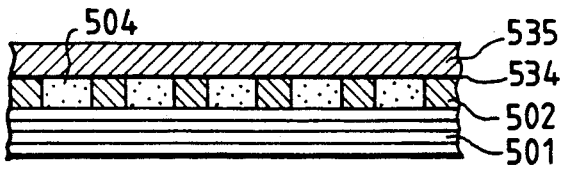
Figure 21C:
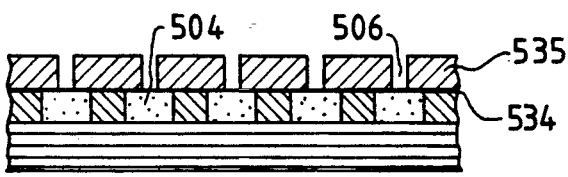

First, similarly as in the case of Example 16, on the surface of a copper plate 501 having a tungsten (W) film formed by lamination on the surface was coated a resist 502, which was pre-baked and then subjected to exposure and developing to form holes with the W film on the surface of the copper plate 501 exposed at the bottom. Into the holes were filled by gold 504 by gold plating so that its surface became coplanar with the surface of the resist 502, and a metal layer 534 comprising three layers of Ni/Ti/Ni was formed by lamination according to the vapor deposition method over the surfaces of the resist 502 and the gold 504 (FIG. 21A). The whole surface of the metal layer 534 was again coated with the photosensitive polyimide resin 535, followed by prebaking (FIG. 21B).

Figure 21D:
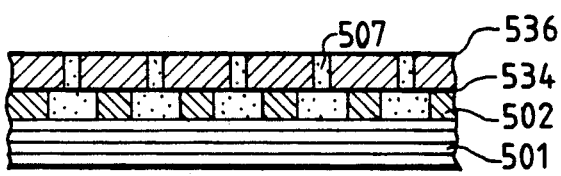
Figure 21E:
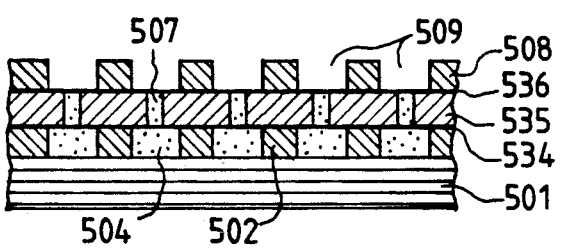
Figure 21F:
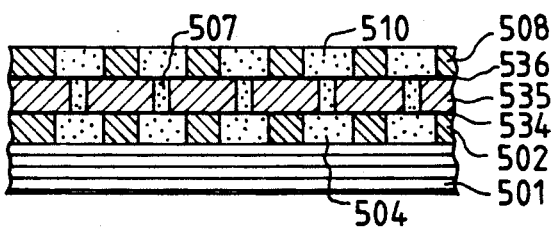
Figure 21G:
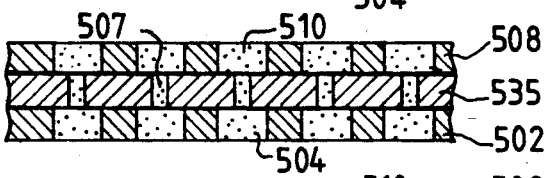

The photosensitive polyimide resin 535 was subjected to exposure and developing, to perforate holes 506 at the positions corresponding to the above-mentioned gold 504, respectively, having smaller diameter than that of the gold 504 with the surface of the metal layer 534 exposed at the bottom (FIG. 21C), end by use of the metal layer 534 as the electrode, gold 507 was filled into the holes 506 so that the surface of the gold 507 became coplanar with the surface of the photosensitive resin 535, followed by lamination of the same metal layer 536 as the above-mentioned metal layer 534 on the surface of the photosensitive polyimide resin 535 together with the surface of the gold 507 (FIG. 21D). Next, the resist 508 was again coated on the surface of the metal layer 536, and after pre-baking, the resist 508 was subjected to exposure and developing to form holes 509 with the metal layer 536 exposed et the bottom having approximately the same diameter as that of the gold 504 at the positions corresponding to the gold 507 (FIG. 21E).

Figure 21H:
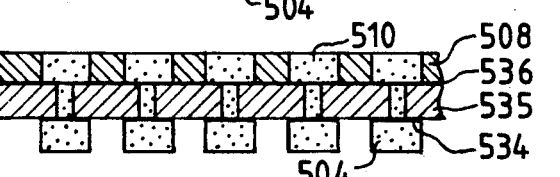
Figure 21I:
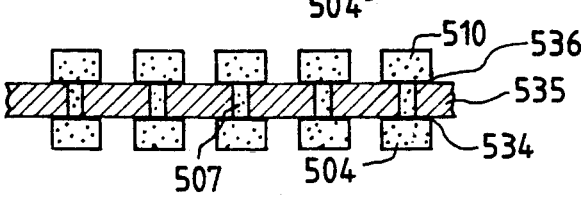

Gold plating was applied until the gold 510 was filled into the holes 509, and the surface of the gold 510 became coplanar with the surface of the resist 508 (FIG. 21F), the copper plate 501 was etched away (FIG. 21G) and the hard baked resist 502 and the metal layer 534 were removed by dry etching by use of RIE or wet etching (FIG. 21H). The other resist 508 and the metal layer 536 were also removed similarly as shown in FIG. 21I to prepare an electrical connecting member in which gold 504, 507 and 510 constitute the electroconductive member and the photosensitive polyimide resion 535 constitutes storability.

In the present Example 17, since metal layers 534, 536 are provided between the resists 502, 508 and the photosensitive polyimide resin 535, mutual adhesion between the resists 502, 508 and the photosensitive polyimide resin 535 is high, whereby precision of fine working was improved. It has also become possible that the photosensitive polyimide resin 535 can shield the influences of various solvents, chemical to be used in the later steps, whereby stable characteristics could be maintained. Further, when another material such as inexpensive Cu, Ni, etc. is employed in place of Au as the electroconductive material to be filled in the holes 506 of the photosensitive polyimide resin 535, the gold 504 end 510 forming the protruded bump could be shielded from these metals to inhibit alloy formation, whereby connection to the electrode portions of other electrical circuit parts could be done by the gold 504, 510 to enhance reliability.

EXAMPLE 18

Figure 22:
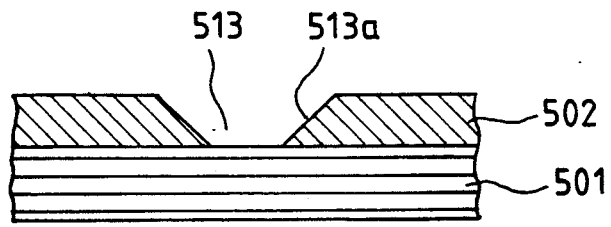
FIGS. 22A through 22C are schematic sectional views showing the principal steps of the preparation process according to another example of the present invention.
Figure 22:
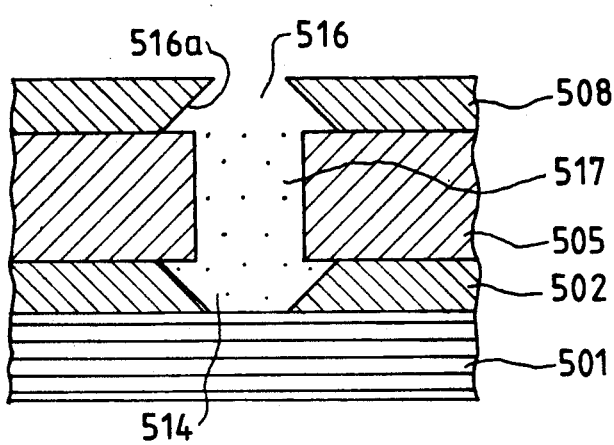
Figure 22:
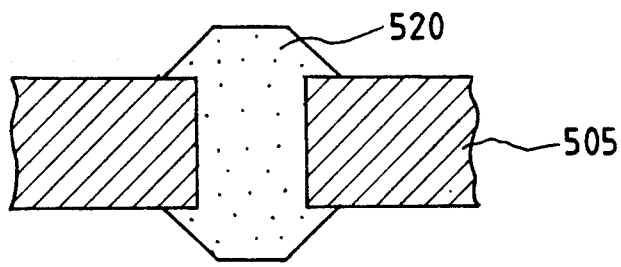

FIGS. 22A to 22C are schematic sectional views showing the principal steps in another embodiment according to the present invention, which shows the case when preparing an electrical connecting member with a different bump shape.

On the surface of a copper plate 501 having a W film formed on its surface was coated a resist 502, which was pre-baked and then subjected to exposure and development by varying the exposure and development conditions to impact a taper 513a to the hole 513 formed on the resist 502.

This was done by setting slightly excessively the developing processing in the development process so as to make the diameter of the hole 513 reduced gradually in the depth direction, thereby forming the taper 513a (FIG. 22A).

Next, gold 514 was filled in the hole 513 according to the gold plating method so that the surface became coplanar with the surface of the resist 502. Then, on the whole surface of the gold 514 and the resist 502 was coated a photosensitive resin 505, which was pre-baked and then subjected to exposure and development, thereby opening a hole having a diameter smaller than the surface diameter of the gold 514 with the gold 514 exposed at the bottom, and gold 517 was filled into the hole according to the gold plating method so that its surface became coplanar with the surface of the photosensitive resin 505. Again, over the whole surface of the gold 517 and the photosensitive resin 505, a resist 508 was coated, prebaked and then subjected to exposure and development, thereby forming holes 516 with the surface of gold exposed at the bottom at the position corresponding to the gold 517. During formation of the hole 516, exposure was set slightly excessive to that than in the ordinary case. By doing so, the diameter of the hole 516 was gradually expanded in the depth direction, whereby the diameter at the bottom of the hole 516 became larger than that of the gold 517 to form a tapered surface 516a (FIG. 22B). Again, by gold plating by use of the gold 517 as the electrode, gold 520 was filled so that the surface within the hole 516 became coplanar with the surface of the resist 508. Thereafter, the copper plate 501 was etched away, and then the resist 502 was removed by O₂ plasma ashing, and the resist 508 with a resist peeling liquid.

By doing so, as shown in FIG. 22C, the golds 514, 517, 520 constituted the electroconductive member, the photosensitive resin 505 constituted the holding member, and yet the both ends protruded from the photosensitive resin 505 each formed a truncated cone shape, and a bump with the diameter of the protruded base larger than that of the gold 517 and the diameter of the protruded end smaller than that of the gold 517 was formed.

Figure 23:
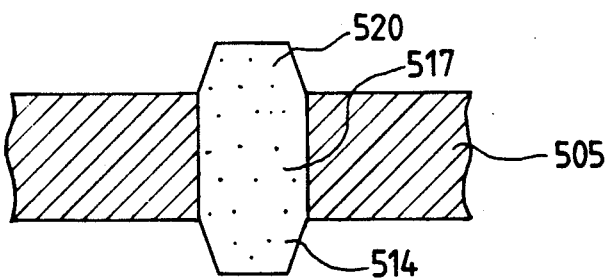
FIGS. 23A and 23B are schematic sectional views showing the principal steps of the preparation process according to another example of the present invention.
Figure 23:
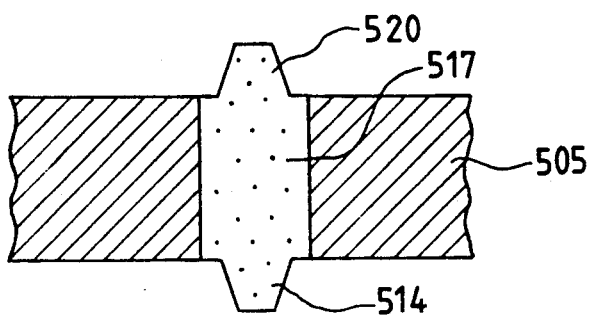

FIGS. 23A and 23B similarly show that the golds 514, 520 protruded from the photosensitive resin 505 each form a truncated cone shape, and in the bump shown in FIG. 23A, the diameter of the protruded base is equal to that of the gold 517, while in the bump shown in FIG. 23B, the diameter of the protruded base is smaller than that of the gold 517. These bumps could all be formed by combining the conditions in the exposure and development steps, namely excessive exposure and excessive development.

EXAMPLE 19

Figure 24:
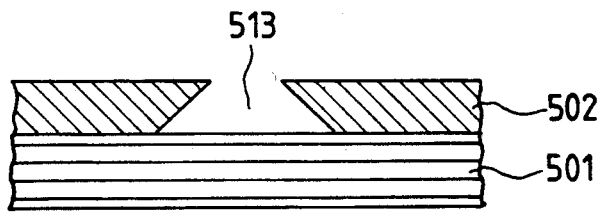
FIGS. 24A through 24C are schematic sectional views showing the principal steps of the preparation process according to another example of the present invention.
Figure 24B:
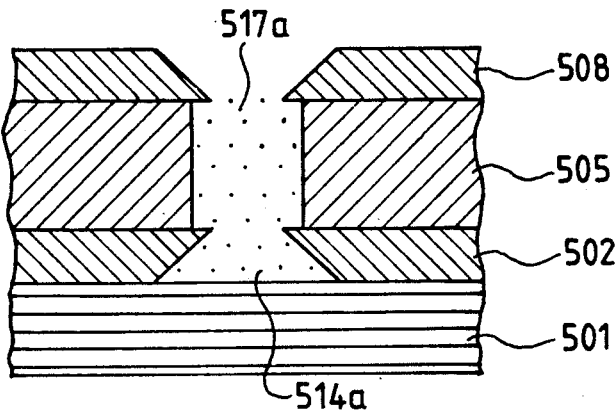
Figure 24:
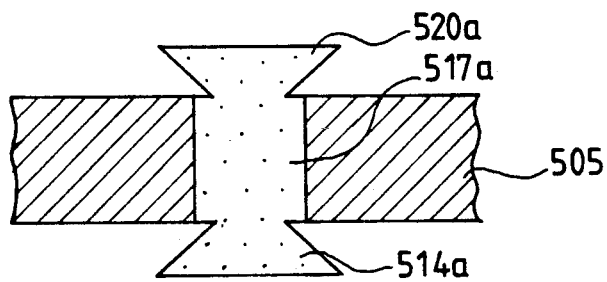

FIGS. 24A to 24C are schematic sectional views showing the principal preparation steps in another example according to the present invention, and the shape of the bump protruded from the holding member surface is formed so as to become an inversed truncated cone shape which is gradually increased in diameter toward the protruded direction.

First, a resist 502 was coated on the surface of the base member 501 having W film formed on its surface, pre-baked and then the resist 502 was subjected to exposure and development to form holes 513. As the exposure and development conditions for the resist 502, the conditions for the resist 508 in Example 18, and as the exposure and development conditions for the resist 508, the exposure and development conditions for the resist 502 in Example 18 may be applied. Other steps are approximately the same as the steps in Example 18, and their descriptions are omitted.

By doing so, as shown in FIG. 24C, a bump shaped in inversed truncated cone with the diameter of the portion of the golds 514a, 520a in contact with the gold 517a being smaller than that of the gold 517a, and the diameter at the protruded end being larger than that of the gold 517a was formed.

Figure 25:
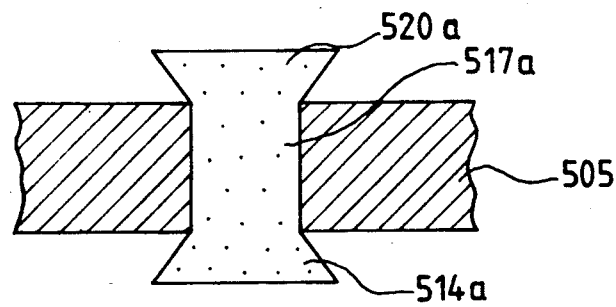
FIGS. 25A through 25B are schematic sectional views of other electrical connecting members prepared by the preparation process according to the examples shown in FIGS. 21A through FIG. 24C.
Figure 25:
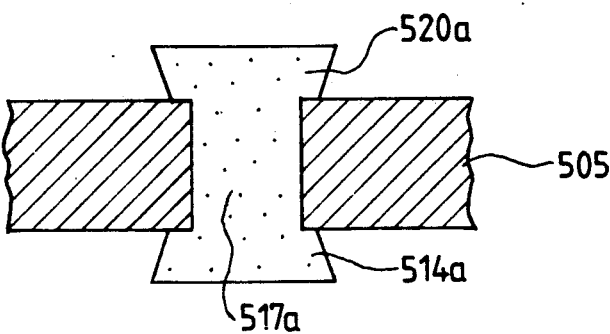

FIGS. 25A and 25B are sectional views showing another shape of the bump, and the diameter of the portion connected to the gold 517a to each of golds 514a, 520a is equal to that of the gold 517a in the bump shown in FIG. 25A, while it is larger than that of the gold 517a in the bump shown in FIG. 25B.

EXAMPLE 20

Figure 26:
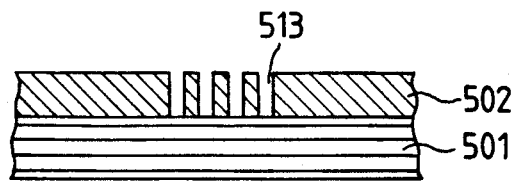
FIGS. 26A through 26C are schematic sectional views showing the principal steps of the preparation process according to another example of the present invention.
Figure 26:
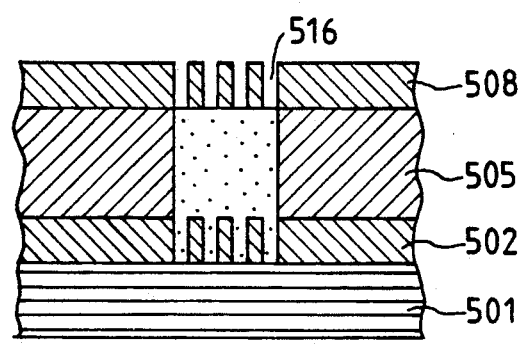
Figure 26:
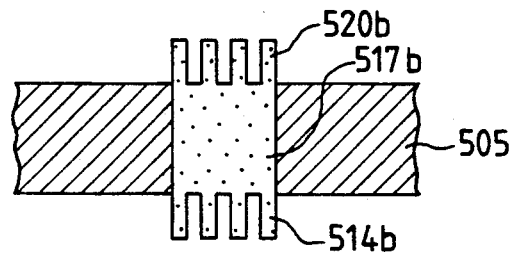

FIGS. 26A to 26C are schematic sectional views showing the principal steps of another example according to the present invention, wherein the shape of the portion protruded from the surface of the holding member has a structure constituted of a plurality of projections. Each projection is made like a bar.

First, a resist 502 was coated on the surface of a copper plate 501 having a W film on its surface, pre-baked and then subjected to exposure and development, thereby forming a plurality of small holes 513 with the surface of the W film exposed at the bottom Of the resist at predetermined intervals (FIG. 26A). Into each hole 513 was filled gold 514b by the gold plating method so that the surface of the gold 514b became coplanar with the surface of the resist 502, and a photosensitive resin 505 was coated on the surface of the resist 502 including the gold 514b surface, followed by pre-baking. Then, the coating was exposed and developed to form holes for exposure of the gold 514b and the resist at the bottom at the positions corresponding to the above-mentioned small holes 513, and into the holes was filled gold 517b so that its surface became coplanar with the surface of the photosensitive resin 505.

Next, a resist 608 was coated over the whole surface of the gold 517b and the photosensitive resin 505, this was pre-baked and then subjected to exposure and development to form a plurality of small holes 516 with the gold 517b exposed at the bottom at the positions corresponding to the above-mentioned gold 517b (FIG. 16B). The respective small holes 516 are not necessarily required to correspond to the small holes 513 of the resist 502. Into the small holes 516 was filled gold 520*b* so that its surface became coplanar with the surface of the resist. Thereafter, the copper plate 501 was etched away, and the resists 502, 508 were removed by etching or by use of a peeling liquid. Thus, as shown in FIG. 26C, an electrical connecting member was prepared, in which the golds 514*b*, 517*b*, 520*b* constitute the electroconductive material, end the photosensitive resin 505 is the holding member.

Figure 27:
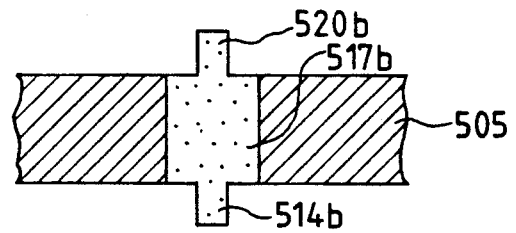
FIGS. 27A through 27C are schematic sectional views of other electrical connecting members prepared by the preparation process according to the example shown in FIGS. 26A–26C.
Figure 27:
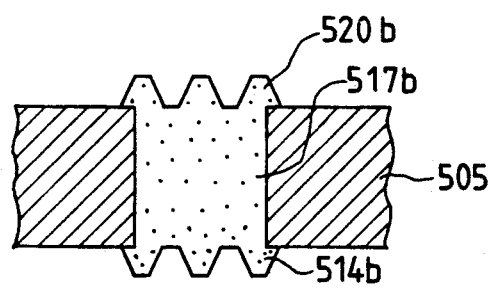
Figure 27:
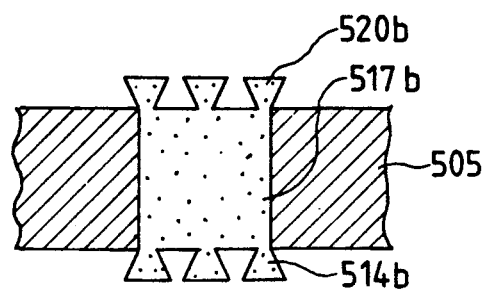

FIGS. 27A-27C are schematic sectional views of the cases when the shape of a plurality of bumps protruded from the photosensitive resin are in other shapes, FIG. 27A showing the case of a columnar shape where the projection 520*b* is smaller than the diameter of the gold 517*b*, FIG. 27B the case where the projection are in the form of a truncated cone at the projected base end, and further FIG. 27C the case where the projections are shaped in inversed truncated cone.

The example shown in FIG. 27A was prepared by making the holes 503, 509 formed on the resists 502, 508 in Examples 18, 19 columnar. The member shown in FIG. 27B was prepared by making the holes 503, 509 formed on the resists 502, 508 in Example 18 respectively a plurality of holes with small diameters. Further, the member of FIG. 27C was prepared by making the holes 503, 509 formed on the resists 502, 508 in Example 19 respectively a plurality of holes with small diameters.

According to this Example, it has become possible to deform the bump under low load by making it finer, whereby connection mutually between electrical circuit parts can be done surely under low load.

In Examples 16 to 20, the constitution by use of a copper plate 501 having a W film formed on the surface as the base member has been described, but this is not particularly limitative, but a high melting metal such as Mo, Ni, etc. which upon heat treatment with the electroconductive member forms an alloy and forms no intermetallic compound may be used in place of W. The base member itself may be also formed of these, and a material which can be removed without etching of the holding member 565 and the electroconductive member 564 may be employed.

As the holding member which is an electrically insulating material, the photosensitive resin 505, the thermosetting resin 515, the photosensitive polyimide resist 525 or its film 545, 547 have been employed, but these are not limitative, but other insulating epoxy resins, silicone resins and films of these may be also employed. In these resins, one or plural kinds of inorganic materials, metal materials, alloy materials shaped in desired shapes such as powder, fiber, plate, bar, sphere, etc. may be also contained dispersed therein. Specific examples of metal materials and alloy materials may include Au, Ag, Cu, Al, Be, Ca, Mg, Mo, Fe, Ni, Co, Mn, W, Cr, Nb, Zr, Ti, Ta, Zn, Sn, Pb-Sn, etc., while as the inorganic materials to be contained, there may be included ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

Further, gold was employed as the material for the electroconductive member 564, but in place thereof, metals or alloys of Cu, Ag, Be, Ca, Mg, Mo, Ni, W, Fe, Ti, In, Ta, Zn, Al, Sn, Pb-Sn, etc. may be used. The cross-sectional shape of the electroconductive member 564 can be made round, square or other shapes, but it is desirable that a shape having no corner is desirable for avoiding excessive concentration of stress.

The electroconductive member 564 is not required to be arranged vertically in the holding member 565, but may be also oblique from one surface side of the holding member 565 to the other surface side of the holding member 565.

EXAMPLE 21-1

FIGS. 28A-28F are schematic sectional views showing the preparation steps of another example according to the present invention.

Figure 28:
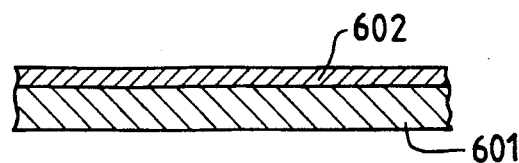
FIGS. 28A through 28F are schematic sectional views showing the steps of the preparation process according to another example of the present invention.
Figure 28:
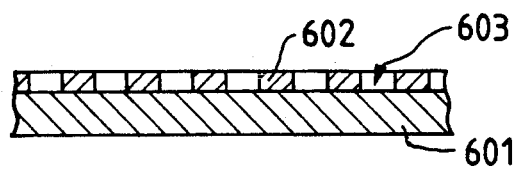
Figure 28:
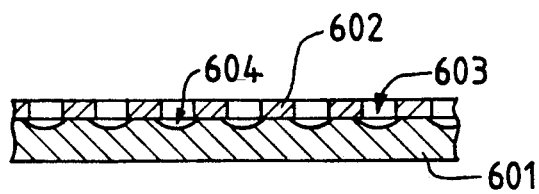
Figure 28:
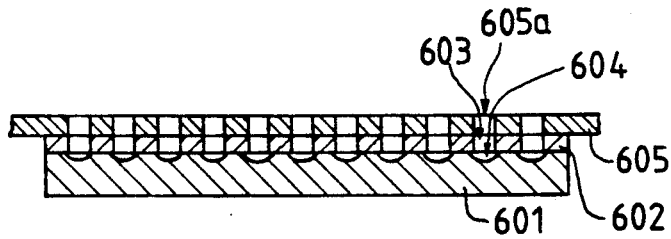
Figure 28:
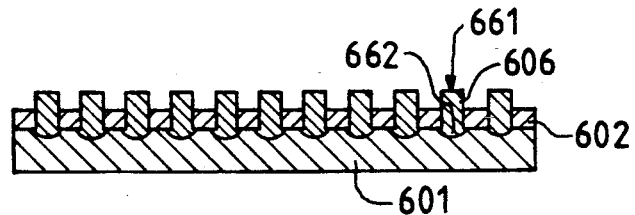
Figure 28:
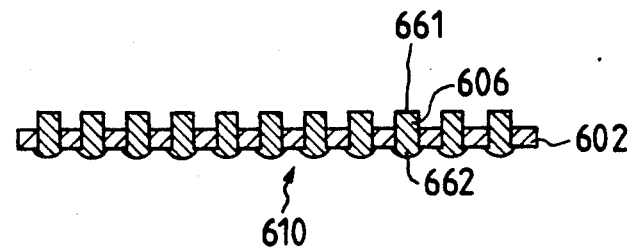

As the base member 601, for example, a copper foil is used, and a matrix was prepared by coating, for example, a polyimide resin as the insulating layer 602 which is the above-mentioned holding member on the base member 601, followed by pre-baking (FIG. 28A). Next, light was irradiated (exposure) on the insulating layer 602 through a photomask having an arranged pattern of the electroconductive member formed thereon, followed by development. In this Example, by use of a nega-type photomask, the polyimide resin remained after development on the portion irradiated with light, and the polyimide resin was removed by development at the portion not irradiated with light, whereby a plurality of holes 603 were formed (FIG. 28B). Then, the polyimide resin was imidated by elevating the temperature to cure the insulating layer 602.

Next, the base member 601 exposed by the holes 603 was etched to form concavities 604 communicated to the holes 603 on the base member 601 (FIG. 28C) According to the progress extent of the etching, the depth of the concavity 604 could be controlled, whereby the protruded height of the bump formed within the concavity 604 in the later step could be controlled.

Next, a mask 605 by use of a screen having holes 605*a* with the same pattern as the arranged pattern of the holes 603 on the insulating layer 602 was mounted with registration so that the holes were matched to each other on the insulating layer 602 (FIG. 28D), and an electroconductive paste was printed on the insulating layer 602 and the base member 601 according to the screen printing method. The screen as herein used for the mask 605 may include mesh screen, metal screen, etc., and by preparing several kinds with different thicknesses for the mask 605 and using them selectively, the height of the electroconductive paste filled within the holes 605*a* could be varied, and therefore the protruded height of the electroconductive paste within the hole 605*a*, namely the bump formed on the upper surface of the insulating layer 602 could be controlled.

As the electroconductive paste, silver palladium type conductor and silver platinum type conductor, gold and silver palladium, gold platinum type conductor, etc. may be employed, including specifically gold paste, copper paste, silver paste, silver palladium paste, etc.

In the screen printing method, while pushing the electroconductive paste by means of a moving squeeze, it was filled from the holes 605*a* of the screen 605 into the holes 603 of the insulating layer 602 and the concavities 604 of the base member 601. Since the squeeze move in uniform contact with the screen surface, solvent resistance and abrasion resistance were required, and therefore polyurethane, polychloroprene, fluorinated carbon, etc. were employed.

When the electroconductive paste is filled to the upper surface of the screen 605, namely to the protruded height as demanded, the screen 605 is removed to effect level registration of the electroconductive paste, followed by drying in an atmosphere of 100° to 150° C. for 5 to 10 minutes. thereby evaporating most of the organic solvents in the electroconductive paste to cure the paste. By doing so, as shown in FIG. 28E, the electroconductive paste was formed as the electroconductive member 606, and the bump 661 on the surface of the insulating layer 602, and the bump 662 within the concavity 604 of the base member 601 were respectively formed.

Finally, by etching away the base member 601 by use of an etchant which will not etch the insulating layer 602 and the electroconductive member 606, an electrical connecting member 610 was prepared (FIG. 28F).

In the above Example, copper which is an electroconductive material was employed for the base member 601, but no plating treatments is required to be performed as the method for forming the electroconductive member 606, and therefore a non-electroconductive material may be also used in place thereof.

EXAMPLE 21-2

Figure 29A:
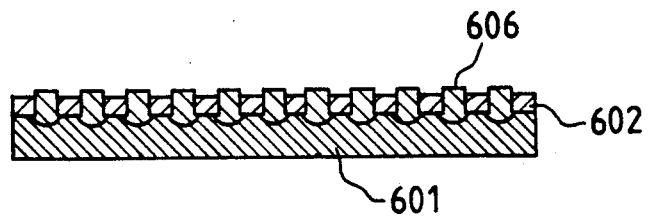
FIGS. 29A through 29C are schematic sectional views showing the principal steps of the preparation process according to another example of the present invention.
Figure 29B:
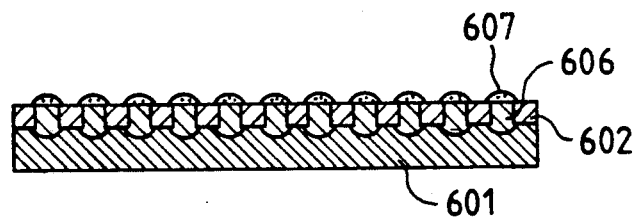
Figure 29C:
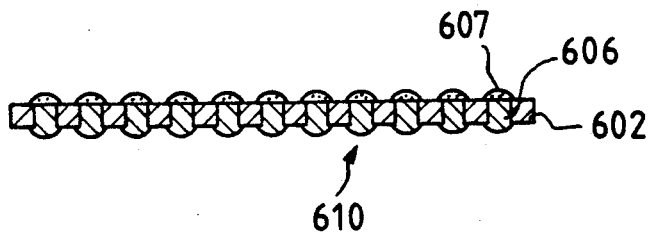

FIGS. 29A-29C ere schematic sectional views showing the preparation steps of another example according to the present invention. First, the preparation of FIG. 28A to FIG. 28E shown in Example 21-1 are practiced to prepare a constitution shown in FIG. 29A. Here, the base member 601 must to be an electroconductive material.

Next, plating was effected by use of gold, etc. with the base member 601 as the common electrode to form a bump 607 on the electroconductive member 606 (FIG. 29B). The base member 601 was then etched away to prepare an electrical connecting member 610 (FIG. 29C). In the electrical connecting member 610 according to the preparation process, protruded height of the bump 607 can be suitably formed as low as possible. In other words, by use of a screen 605 which is as thin as possible, the protruded height of the electroconductive member 606 shown in FIG. 29A is formed low. However, when subsequently the base member 601 is etched away under this state, there is a fear that the electroconductive member 606 may be sunk downward, namely toward where the base member 601 existed or dropped off, whereby defective connection with the electrical circuit part may be brought about. Accordingly, for prevention of this, a bump is formed by plating of an electroconductive material. The plating treatment, which is carried out only for formation of the bump 607, does not require a long time, and even when a noble metal may be employed as the electroconductive material, only a small amount is necessary and therefore the cost increase can be kept at a minimum.

EXAMPLE 22

FIGS. 30A-30I are schematic sectional views showing the preparation steps of another example according to the present invention.

Figure 30:
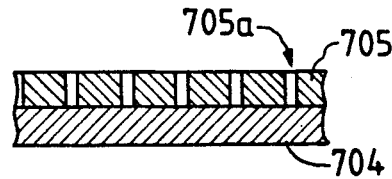
FIGS. 30A through 30I are schematic sectional views showing the principal steps of the preparation process according to another example of the present invention.
Figure 30:
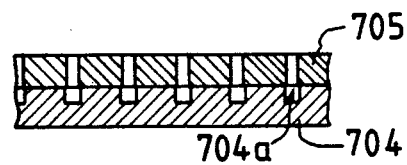
Figure 30:
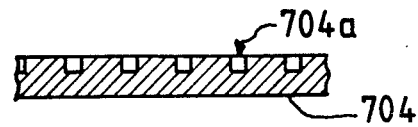
Figure 30:
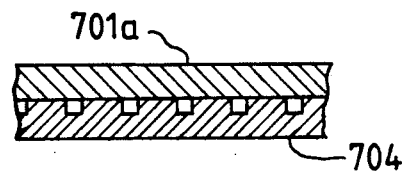
Figure 30:
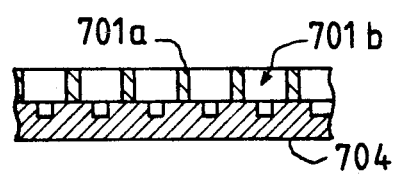
Figure 30:
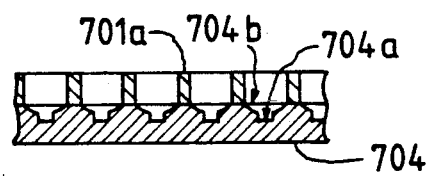
Figure 30:
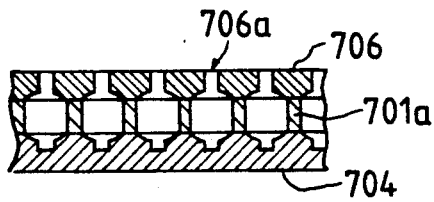
Figure 30:
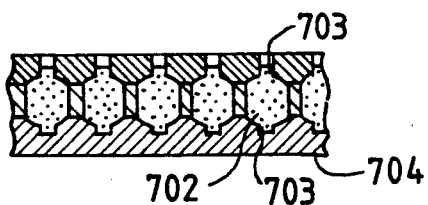
Figure 30:
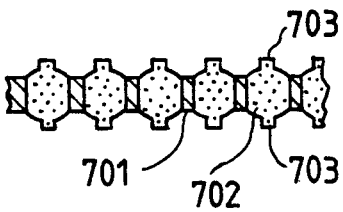

In FIG. 30A, 704 is a base member, and on the base member 704 was located a mask 705 having a plurality of thru-holes 705a formed thereon. The number and the formation positions of the thru-holes 705a were made equal to the number and the arrangement positions of the projections 703 to be formed. Next, as shown in FIG. 30B, the base member 704 exposed by the thru-holes 705a of the mask 705 were etched in an amount sufficient to form concavities 704a in the base member 704. The depth of the concavity 704a can be controlled according to the progress extent of such etching to control the protruded height of the projection 703 formed within the concavity 704a according to the depth of the concavity 704b formed in the later step.

Next, the mask 705 was removed to have the base member 704 with a plurality of concavities 704a formed thereon exposed (FIG. 30C), and an insulating material such as polyimide resin, etc. which later becomes the holding member 701 is coated on the surface by spin coating method, etc., followed by pre-baking, to form an insulating layer 701a (FIG. 30D).

Next, through the photomask having the arrangement pattern of the electroconductive member 702 formed thereon, light was irradiated (exposure) on the insulating layer 701a, followed by developing. In this Example, by use of a nega-type photomask, the polyimide resin remained after development at the portion where light was irradiated, while the polyimide resin was removed by development at the portion where no light was irradiated, whereby a plurality of holes 701b were formed (FIG. 30E). In brief, by these holes 701b, again the concavities 704a of the base member 704 and the portion therearound will be exposed at the bottom of the respective holes 701b. Then, the polyimide resin was imidated by elevating the temperature to cure the insulating layer 701a.

Next, the base member including the concavities 704a respectively exposed by the above-mentioned holes 701b and the portion therearound was etched to form concavities 704b communicated to the holes 701b on the base member 704 (FIG. 30F). Here, the progress extent of etching was controlled so that the depth of the concavity 704b became shallower than the concavity 704a. Thus, a plurality of concavities 704b were formed on the base member 704, whereby the concavities 704a will exist at the inner bottoms of the respective concavities 704b.

Next, a mask 706 having e plurality of thru-holes 706a for communicating individually the holes 701b of the insulating layer 701a was provided on the insulating layer 702 (FIG. 30G). Briefly, the thru-holes 706a are formed on the mask 706 approximately equal to the arrangement state of the holes 701b so as to match with the holes 701b, and their sizes are made approximately equal to those of the holes at the lower surface, namely on the side of the insulating layer 701a, while being made smaller than this on the upper surface side. Briefly, this is because bumps of the electroconductive member 702 are formed at the larger diameter portion of the thru-holes 706a, and the projections at the smaller diameter portion, respectively.

Next, en electroconductive material was filled into the concavities 704a, 704b of the base member 704, the holes 701b of the insulating layer 701a and the thru-holes 706a of the mask 706. Then, the electroconductive material was filled up to the desired height within the small diameter portion of the thru-holes 706a of the mask 706, namely the desired height of the projection to complete the filling treatment (FIG. 30H). By doing so, the electroconductive material was formed as the electroconductive member 702, and the projections 703, 703 were respectively formed within the thru-holes 706a of the 706 and within the concavity 704a of the base member 704.

Finally, the mask 706 was removed, and the base member 704 was etched away by use of an etchant which will not etch the insulating layer 701a and the electroconductive member 702, thereby preparing an electrical connecting member 707 (FIG. 30I).

Figure 31:
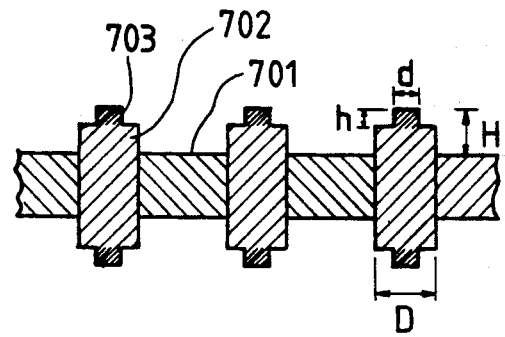
FIGS. 31A through 31C are schematic sectional views of the electrical connecting member prepared by the preparation process according to the example shown in FIGS. 29A–29C.
Figure 31:
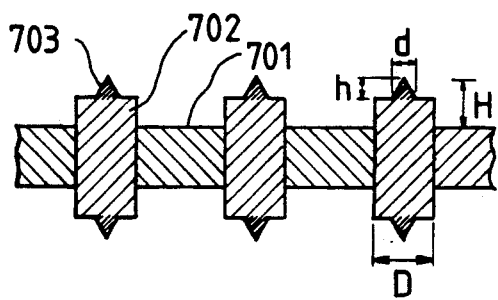
Figure 31:
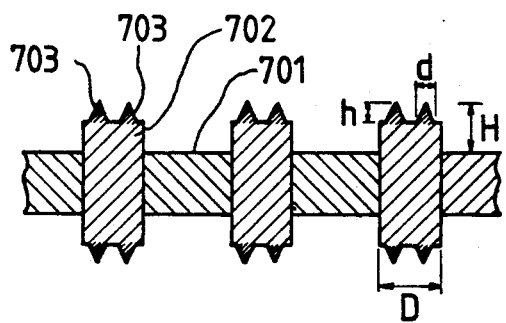

FIGS. 31A to FIG. 31C are schematic sectional views showing the constitution of the electrical connecting member according to the present Example. The plate-shaped holding members 701 each comprising an insulating material are equipped with a plurality of electroconductive members 702 with the both ends protruded in adequate length. The electroconductive member 702 had projections 703 which are the pertinent portions of the present Example provided at the both ends. The shape of the projection 703 may be either a rectangular cross-section as shown in FIG. 31A, or a triangular cross-section as shown in FIG. 31B and FIG. 31C. Also, as shown in FIG. 31C, every two or more projections may be provided.

Table 3 shows the connecting situations with electrical circuit parts in the electrical connecting member according to the present invention and the product of the prior art. (A) to (C) in the column called "Shape" mean the shape of the electroconductive member and correspond to the shapes in FIG. 31A to 31C, and (D) corresponds to the shape of the electroconductive member prepared according to the prior art process as shown in FIGS. 2A-2F. The column called "Dimention" means the dimension of the electroconductive member as shown in FIGS. 31A to 31C, D representing the diameter of the electroconductive member, d the maximum diameter of the projection, H the height from the holding member surface of the highest portion of the projection, h the height of the projection in the electroconductive member, and H in the prior art product (D) the projection height only of the bump.

All of the products No. 1 to No. 3 according to the present Example connected semiconductor circuits to a print wiring base member under the alloy forming conditions of a heating temperature of 250° C. or lower and a pressurizing force per one electroconductive member of 50 gf or lower to give good connection results. For the product No. 4 according to the present Example, because the diameter of the electroconductive member is smaller than the products No. 1 to No. 3, the pressurizing force was lowered to 10 gf, but similarly good connection results were obtained.

On the other hand, for the product No. 5 of the prior art, for ensuring bondability with electrical circuit parts, connection was effected under the alloy forming conditions of a heating temperature of 300° C. and a pressurizing force of 100 gf, but because of excessive pressurizing force, cracking of semiconductor circuits occurred in some of the samples. Also, for the product No. 6, alloy forming connection was effected under the same conditions, but because of excessive heating temperature, deterioration of liquid crystal elements was found in some of the samples.

For the product No. 7, the same one as used for the product No. 5 was attempted to be connected under the same alloy forming conditions as used for the product No. 1, no sufficient alloy formation could be effected, and therefore occurrence of peel-off at the connecting portion was found in some samples.

TABLE 3

| Product No. | Class | Shape | Dimension ($\mu$m) | | | | Material | Electrical circuit part Upper stage: upper side circiut Lower stage: lower side circuit |
| | | | D | d | H | h | | |
| --- | --- | --- | --- | --- | --- | --- | --- | --- |
| 1 | Present example | (A) | 75 | 25 | 10 | 5 | Au | Semiconductor circuit (IC) Print wiring substrate |
| 2 | ↓ | (B) | ↓ | ↓ | ↓ | ↓ | ↓ | ↓ |
| 3 | ↓ | (C) | ↓ | ↓ | ↓ | ↓ | ↓ | ↓ |
| 4 | ↓ | (C) | 30 | 10 | 5 | 3 | ↓ | Liquid crystal element Print wiring substrate |
| 5 | Prior art product | (D) | 75 | — | 10 | — | ↓ | Semiconductor circuit (IC) Print wiring substrate |
| 6 | ↓ | ↓ | 30 | — | 5 | — | ↓ | Liquid crystal element Print wiring substrate |
| 7 | ↓ | ↓ | 75 | — | 10 | — | ↓ | Semiconductor circuit (IC) Print wiring substrate |

| Product No. | Alloy forming connecting conditions | | Remarks |
| | Heating temperature (°C.) | Pressurizing force* (gf) | |
| --- | --- | --- | --- |
| 1 | 250 | 50 | Good |
| 2 | 250 | 30 | ↓ |
| 3 | 200 | 30 | ↓ |
| 4 | 200 | 10 | ↓ |
| 5 | 300 | 300 | IC cracking loss found in a part |
| 6 | 300 | 100 | Because of excessive heating temperature, deterioration of liquid crystal element found in a part |
| 7 | 250 | 50 | Because of defective bonding, peel-off occurrence found in a part |

*Pressurization force per one electroconductive member

EXAMPLE 23

FIGS. 32A-32F are schematic sectional views showing the preparation steps of another example according to the present invention.

Figure 32A:
FIGS. 32A through 32F are schematic sectional views showing the steps of the preparation process according to another example of the present invention.
Figure 32B:
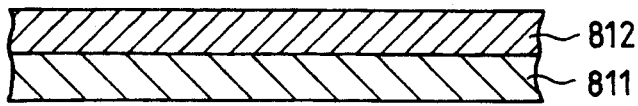

First, a copper plate 811 which is the base member was provided (FIG. 32A), and a nega-type photosensitive resin of a polyimide resin 812 was coated on one surface of the copper plate 811 and prebaked at a temperature around 100° C. (FIG. 32B). For the coating method, spin coater, roll coater, etc. can be employed, and also any desired method which can give uniform film thickness may be employed.

Figure 32C:
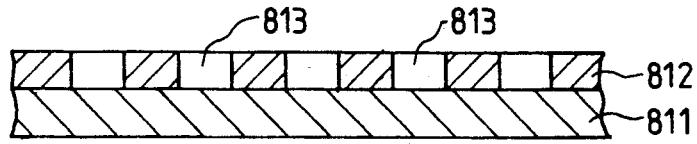

Through a photomask for forming a predetermined pattern (not shown) light was irradiated (exposed) on the polyimide resin 812 and then developing was carried out. In this Example, the polyimide resin 812 remained at the portion exposed, while the polyimide resin 812 was removed by the development at the unirradiated portion, whereby a plurality of holes 813 were formed on the polyimide resin 812 (FIG. 32C). Then, the temperature was elevated to 200° to 400° C, to effect curing of the polyimide resin 812.

Figure 32D:
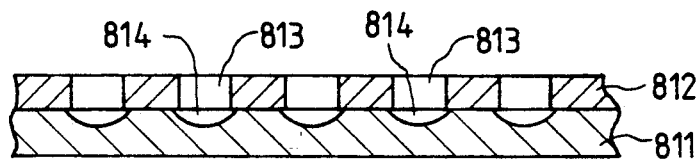

Next, the copper plate 811 applied with such treatments was dipped in an etchant to effect etching. A part of the copper plate 811 near the holes 813 was etched away to form concavities 814 communicated to the holes 813 on the copper plate 811 (FIG. 32D). In this case, the diameter of the concavity 814 to be formed was made greater than the diameter of the hole 813 and smaller than half Of the distance of the adjoining holes 813 to the outer peripheral. Thus, by controlling the size of the concavity 814, an electrical connecting member could be prepared without conduction mutually between the electroconductive members and yet without falling-off of the electroconductive member.

Figure 32E:
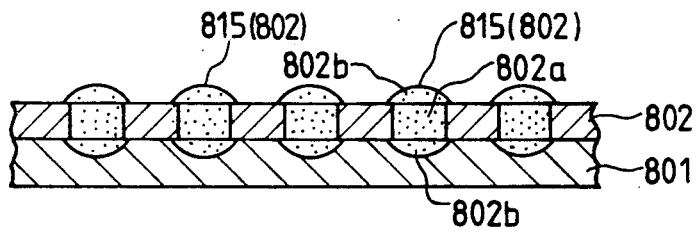
Figure 32F:
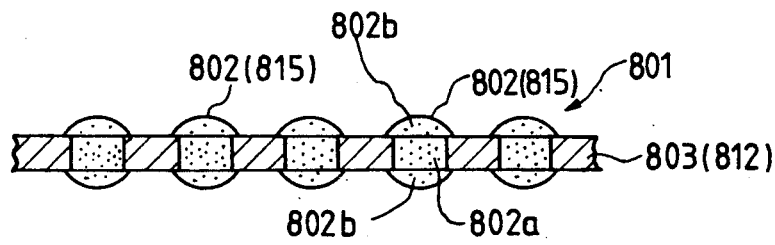

Next, by use of the copper plate 811 as the common electrode, gold 815 was filled into the holes 813 and the concavities 814 by electrolytic plating by use of a sulfurous acid type gold plating solution (e.g. trade name: Neutronex 210N), and further gold plating was continued until the gold 815 was protruded from the surface of the polyimide resin 812 to form an electroconductive member 802 comprising gold 815 (FIG. 32E). Here, according to the preparation process of this Example, in the case of forming bump portions 802b, 802b by applying gold plating on the concavity 814 and the portions protruded from the polyimide resin 812, the temperature Of the plating solution was made higher than in the case of forming the columnar portion 802a by applying gold plating on the hole 813. For example, the plating conditions during formation of the bump portions 802b, 802b were set at a temperature of the plating solution of 60° C., a time of 30 minutes and a precipitated thickness of 5 μm, and the plating conditions during formation of the columnar portion 802a set at a temperature of the plating solution of 20° C., a time of 40 minutes, and a precipitated thickness of 10 μm, and the current density was made constant (0.4 A/cm$^2$) in either case. Finally, the copper plate 811 was removed by metal etching by use of an etchant which etched copper but not the gold 815 and the polyimide resin 812 to prepare an electrical connecting member 801 as shown in FIG. 33F.

Figure 33:
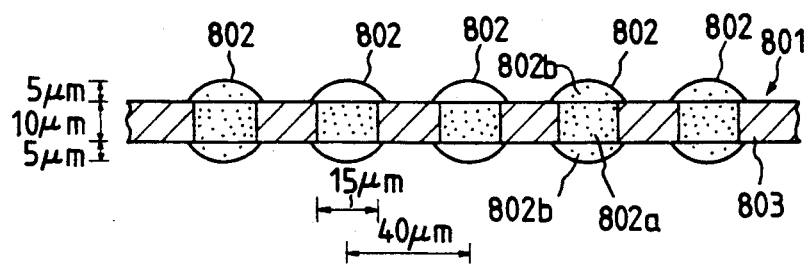
FIGS. 33A through 33C are schematic sectional views of the electrical connecting member prepared by the preparation process according to the example shown in FIGS. 31A–31C.
Figure 33:
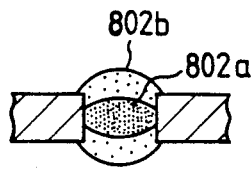
Figure 33:
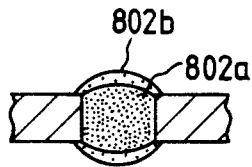

FIGS. 33A-33C are schematic sectional views of the electrical connecting member 801 according to the present Example. The electrical connecting member 801 is constitued of a plurality of electroconductive members 802 comprising, e.g., gold, and holding members 803 comprising, e.g., a polyimide resin equipped with the electroconductive members 802 so that the electroconductive members 802 may be under the state mutually insulated from one another. Each electroconductive member 802 has its both ends protruded from the both surfaces of the holding member 803, and comprises a columnar portion 802a embedded in the holding member 803 and to bump portions 802b, 802b protruded from the holding member 803.

The dimensions of the respective portions in the electrical connecting member 801 may be approximately the same as those of the other Examples, with the thickness of the holding member 803 being about 10 μm, the diameter of the electroconductive member 802 (columnar portion 802a) about 15 μm, the formation pitch of the electroconductive member 802 about 40 μm, the protruded amount of the electroconductive member 802 (protruded height of the respective bump portions 802b, 802b) about 5 μm.

In the present Example, the electroconductive member 802 is formed by varying the temperature of the plating solution, and therefore the crystal grains become smaller and the hardness higher at the columnar portion 802a than at the bump portions 802b, 802b. In the plating conditions as described above, the hardness of the columnar portion 802a became 100 to 200 degrees (Vickers hardness), while the hardness of the bump portions 802b, 802b became 60 to 80 degree (Vickers hardness).

In the Example as described above, the temperature of the plating solution was varied, but also the electrical connecting member 801 as shown in FIG. 33A could be also prepared even when the temperature of the plating solution was made constant, and gold plating was carried out by making the current density higher during formation of the bump portions 802b, 802b than that during formation of the columnar portion 802a. For example, when the plating conditions during formation of the bump portions 802b, 802b were set at a current density of 0.8 A/cm$^2$, a time of 15 minutes, a precipitated thickness of 5 μm, and the plating conditions during formation of the columnar portion 802a at a current density of 0.4 A/cm$^2$, time of 40 minutes end a precipitated thickness of 10 μm, and the temperature of the plating solution set always constant (40° C.) in either case, the hardness of the columnar portion 802a became 80 to 100 degrees, and the hardness of the bump portions 802b, 802b became 60 to 80 degrees. Other steps are the same as in other Examples in which the temperature of the plating solution is varied, and therefore their descriptions are omitted.

In the gold plating step, even if both of the temperature and the current density of the plating solution may be varied, the electrical connecting member 801 as shown in FIG. 33A can be prepared as a matter of course.

Whereas, in the electrical connecting member as described above, the bump portions 802b, 802b of the electroconductive member 802 are made to have uniform hardness, but it is not necessarily required to be uniform as shown in FIG. 33C, but the constitution may also be such that the hardness is gradually decreased as remote from the columnar portion 802a. When preparing an electrical connecting member with such constitution, in forming the bump portions 802b, 802b of the electroconductive member 802 in the gold plating step, the temperature or the current density of the plating solution may be varied continuously. Further, as shown in FIG. 33B, the columnar portion 802a is not necessarily required to have a uniform hardness, but may also constituted such that the hardness is increased toward the central portion.

In Examples 22 to 23, gold was employed as the material for the electroconductive member 802, but other than gold (Au), metals or alloys of Cu, Ag, Be, Ca, Mg, Mo, Ni, W, Fe, Ti, In, Ta. Zn. Al, Sn, Pb-Sn, etc. can be used. The electroconductive member 802 may be formed of one kind of metals and alloys, or alternatively of a mixture of several kinds of metals and alloys. Also, it may be a material comprising one or both of organic materials or inorganic materials incorporated in a metal material. The cross-sectional shape of the electroconductive member 802 can be made round, square or other shapes, but it is desirable that a shape having no corner is desirable for avoiding excessive concentration of stress. The electroconductive member 802 is not required to be arranged vertically in the holding member 803, but may also be oblique from one surface side of the holding member 803 to the other surface side of the holding member 803.

Further, in the present Example, polyimide resin 812 was employed as the holding member 803, but it is not particularly limitative. Also, in the resin, one or plural kinds of inorganic materials, metal materials, alloy materials shaped in desired shapes such as powder, fiber, plate, bar, sphere, etc. may be also contained dispersed therein. Specific examples of metal materials and alloy materials may include Au, Ag, Cu, Al, Be, Ca, Mg, Mo, Fe, Ni, Co, Mn, W, Cr, Nb, Zr, Ti, Ta, Zn, Sn, Pb-Sn, etc., while as the inorganic materials to be contained, there may be included ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

Further, a copper plate 811 was used as the base member, but this is not limitative, and it is also possible to use a thin plate of a metal or alloy such as Au, Ag, Be, Ca, Mg, Mo, Ni, W, Fe, Ti, In, Ta, Zn, Al, Sn, Pb-Sn, etc. However, since only the base member is etched away in the final step, it is required that the material of the electroconductive member 802 should be different from the material used for the base member.

EXAMPLE 24

FIGS. 34A-34F are schematic sectional views showing the preparation steps of another Example according to the present invention.

Figure 34:
FIGS. 34A through 34F are schematic sectional views showing the steps of the preparation process according to another example of the present invention.
Figure 34:
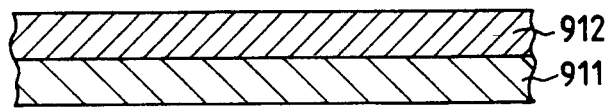
Figure 34:
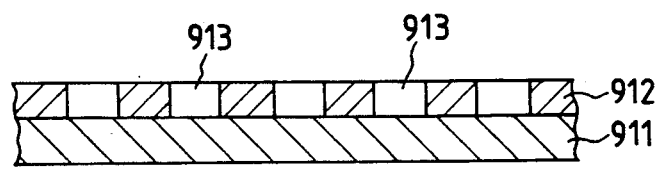
Figure 34:
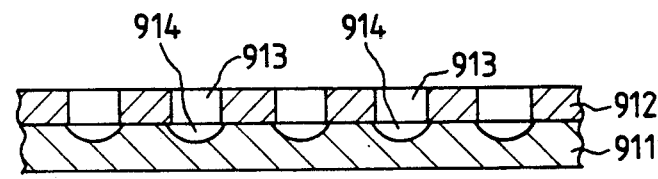
Figure 34:
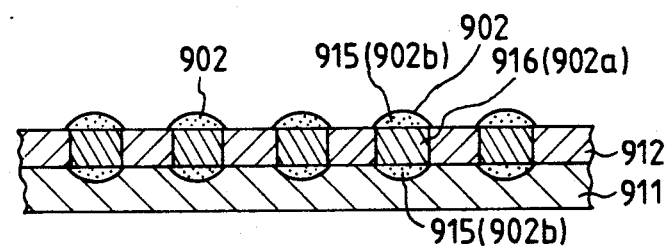
Figure 34:
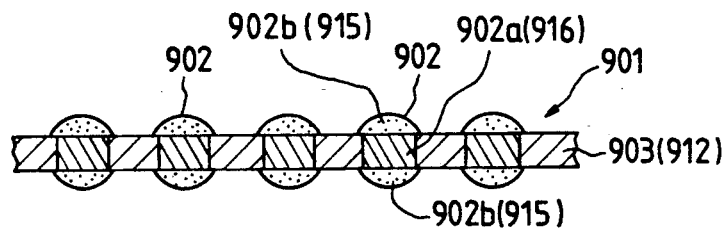

First, a copper plate 911 which is the base member was prepared (FIG. 34A), and a nega-type photosensitive resin of a polyimide resin 912 was coated on one surface of the copper plate 911 and prebaked at a temperature around 100° C. (FIG. 34B).

Next, through a photomask for forming a predetermined pattern (not shown) light was irradiated (exposed) on the polyimide resin 912 and then developing was carried out. In this Example, the polyimide resin 912 remained at the portion exposed, while the polyimide resin 912 was removed by the development at the portion unirradiated, whereby a plurality of holes 913 were formed on the polyimide resin 912 (FIG. 34C). Then, the temperature was elevated to 200° to 400° C. to effect curing of the polyimide resin 912.

Next, the copper plate 911 applied with such treatments was dipped in an etchant to effect etching. A part of the copper plate 911 near the holes 913 was etched away to form concavities 914 communicated to the holes 913 on the copper plate 911 (FIG. 34D). In this case, the diameter of the concavity 914 to be formed was made greater than the diameter of the hole 913 and smaller than half of the distance of the adjoining holes 913 to the outer peripheral. Thus, by controlling the size of the concavity 914, an electrical connecting member could be prepared without conduction mutually between the electroconductive members and yet without falling-off of the electroconductive member.

Next, by use of the copper plate 911 as the common electrode, an electroconductive material was filled into the holes 913 and the concavities 914 by electrolyric plating as described below. That is, by use of a gold plating solution, gold 915 was filled into the concavities 914, and then nickel 916 was filled into the holes 913 by use of a nickel plating solution. When the nickel 916 was filled into the holes 913 until the precipitated surface became substantially coplanar with the surface of the polyimide resin 912, gold plating was again performed by use of the gold plating solution so that it was protruded to a predetermined height from the polyimide resin 912, thereby forming an electroconductive member 902 comprising the columnar portion 902a made of nickel 916 and the bump portions 902b, 902b made of gold 915 (FIG. 34E). Finally, the copper plate 911 was removed by metal etching by use of an etchant which etched copper but not the gold 915, nickel 916 and the polyimide resin 912 to prepare an electrical connecting member 901 as shown in FIG. 33F.

In the present Example, in the electrical connecting member 901 prepared, the nickel 916 constitutes the columnar portion 902a, the gold 915 constitutes the bump portions 902b, 902b of the electroconductive member 902, and the polyimide resin 912 constitutes the holding member 903. Since the columnar portion 902a consists of the nickel 916, the bump portions 902b, 902b consist of the gold 915, the columnar portion 902a has a higher hardness than the bump portions 902b, 902b.

FIGS. 35A to 35E are schematic sectional views of the electrical connecting member 901 according to the present Example.

Figure 35:
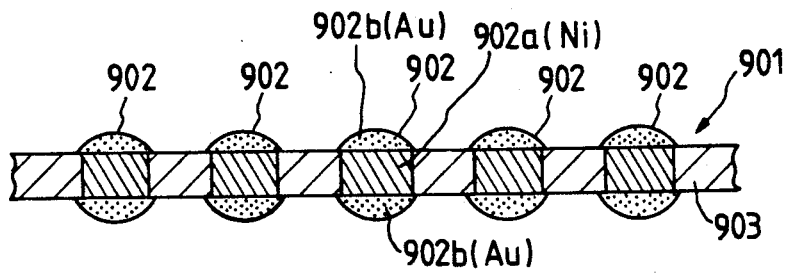
FIGS. 35A through 35E are schematic sectional views of the electrical connecting member prepared by the preparation process according to the example shown in FIGS. 33A–33C.
Figure 35:
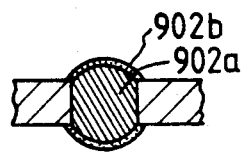
Figure 35:
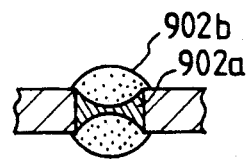
Figure 35:
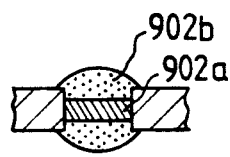
Figure 35:
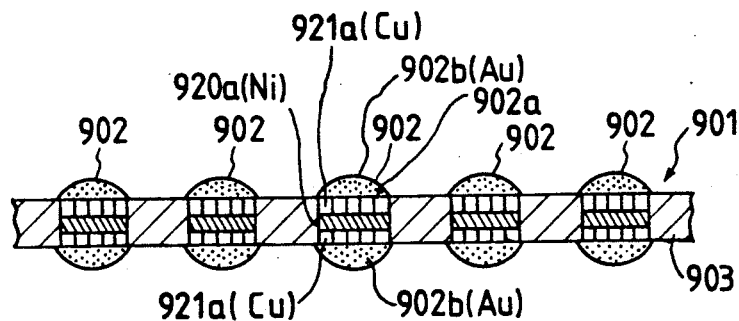

FIG. 35A shows the case when the electroconductive material of the columnar portion 902a is substantially coplanar with the surface of the holding member 903, FIG. 35B the case when the electroconductive material of the columnar portion 902a exists up to a part of the bump portion 902b, and FIG. 35C and 35D the case when the electroconductive material of the bump portion 902b exists up to the columnar portion 902a. FIG. 35E shows the case when the columnar portion 902a of the electroconductive member 902 consists of two kinds of electroconductive materials.

In the Example as described above, nickel and gold were employed as the material for the columnar portion 902a and the bump portions 902a, 902b of the electroconductive member 902, but the columnar portion 902a may be a material relatively higher in hardness than the bump portions 902b, 902b, and as the bump portions 902b, 902b, other than gold (Au), Ag, solder, etc. can be employed, while as the columnar portion 902a, other than nickel (Ni), Cr, Fe, Co, Cu, etc. can be employed. The cross-sectional shape of the electroconductive member 902 can be made round, square or other shapes, but that a shape having no corner is desirable for avoiding excessive concentration of stress. The electroconductive member 902 is not required to be arranged vertically in the holding member 903, but may be also oblique from one surface side of the holding member 903 to the other surface side of the holding member 903.

FIG. 35E has the columnar portion 902a of which the central portion 920a consists of nickel (Ni). and the peripheral portions 921a, 921a consist of copper (Cu). The bump portions 902b, 902b are constituted of gold (Au) similarly as the Example shown in FIGS. 35A to 35D. In this Example, in each electroconductive member 902, there are hardness changes of 3 stages from the central portion to the peripheral portion.

If the electroconductive member 902 consists of a complex constitution of different kinds of metals, and the columnar portion 902a thereof becomes relatively higher in hardness than the bump portions 902b, 902b, any desired constitution can be taken.

Further, in the present Example 24, polyimide resin 912 was employed as the holding member 903, but it is not particularly limitative. Also, in the resin, one or plural kinds of inorganic materials, metal materials, alloy materials shaped in desired shapes such as powder, fiber, plate, bar, sphere, etc. may be also contained dispersed therein. Specific examples of metal materials, alloy materials may include Au, Ag, Cu, Al, Be, Ca, Mg, Mo, Fe, Ni, Co, Mn, W, Cr, Nb, Zr, Ti, Ta, Zn, Sn, Pb-Sn, etc., while as the inorganic materials to be contained, there may be included ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

Further, a copper plate 911 was used as the base member, but this is not limitative, and it is also possible to use a thin plate of a metal or alloy such as Au, Ag, Be, Ca, Mg, Mo, Ni, W, Fe, Ti, In, Ta, Zn, Al, Sn, Pb-Sn, etc. However, since only the base member is etched away in the final step, it is required that the material of the electroconductive member 902 should be different from the material used for the base member.

As described in detail above, in the present invention, an electrical connecting member filled with an electroconductive member so that the diameter of the portion exposed from the holding member may be larger than the diameter of the portion existing in the holding member can be prepared simply at high precision, whereby falling away of the electroconductive member can be surely prevented and improvement of the Yield of the product can be effected. Also, since a desired protruded amount (shape and size) can be surely and simply realized, the present invention can exhibit excellent effects such that an electrical connecting member of high reliability of electrical connection between electrical circuit parts can be obtained, etc.

Further, in the electrical connecting member of the present invention, the columnar portion is higher in hardness as compared with the bump portion in its electroconductive member, and therefore when such an electroconductive member is pressure adhered or thermally pressure adhered to the connecting portion of an electric circuit part, as compared with the columnar portion, the bump portion can be favorably deformed, whereby bonding of the electroconductive member to the connecting portion of the electrical circuit part can be effected under low load. In the prior art, when there are a large number of electroconductive members, it was required to apply an extremely great load by comprehensive bonding, but in the electrical connecting member of the present invention, the deformation will be concentrated on the bump portion and comprehensive bonding of a large number of electroconductive members to the connecting portion is possible without application of a great load. Further, the load to be applied becomes the load which deforms the bump portion, and it therefore becomes possible to easily control the amount of bump deformation whereby high density bonding is rendered possible.

We claim:

1. A process for preparing en electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:

forming a layer on a base member;

forming said holding member comprising a photosensitive resin on the uppermost surface of said layer;

exposing and developing said holding member to form a plurality of holes through said holding member to expose the uppermost surface of said layer;

etching away a part of the exposed uppermost surface of said layer;

filling an electroconductive member in said holes formed on said holding member; and removing said layer and said base member which remain.

2. The process according to claim 1, wherein said electroconductive member is filled until protruded to a predetermined height from the surface of said holding member to form a bump.

3. The process according to claim 1, wherein said layer comprises a first layer and a second layer which is more rapid in etching speed than the first layer.

4. The process according to claim 3, wherein said first layer is Ni layer and said second layer is a Cu layer.

5. The process according to claim 1, wherein said layer is a photosensitive resin different in photosensitive wavelength band from said holding member.

6. The process according to claim 5, wherein said layer is an epoxy resin and said holding member is a polyimide resin.

7. The process according to claim 1, wherein filling of said electroconductive member is performed by electroplating, and the filling conditions of said electroplating are made higher in at least one of temperature of the plating solution and the current density in the case of forming the portion to be protruded from said holding member, as compared with the case when forming the portion to be embedded in said holding member.

8. The process according to claim 2, wherein said electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

9. The process according to claim 1, further comprising the step of forming a wiring pattern on one or both surfaces of said holding member.

10. The process according claim 1, wherein said electroconductive member as filled forms an electrical connecting portion to be connected to the connecting portion of an electrical circuit part, and said connecting portion and said electrical connecting portion are connected metallurgically.

11. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:

forming said holding member comprising a photosensitive resin on a first electroconductive member;

exposing and developing said holding member to form a plurality of holes through said holding member to expose said first electroconductive member;

filling a second electroconductive member in the holes formed in said holding member by electroplating with said first electroconductive member as electrode so that it is protruded to a predetermined height from the surface of said holding member;

removing said first electroconductive member;

forming an electrode over the protruded portions of said second electroconductive member as filled;

having the second electroconductive member protruded to a predetermined height from the back surface of said holding member by electroplating at the end opposite to the protruded portion of said second electroconductive member by use of said electrode; and removing said electrode.

12. The process according to claim 11, wherein the filling conditions of said second electroconductive member by electroplating are made higher in at least one of temperature of the plating solution and the current density in the case of forming the portion to be protruded from said holding member, as compared with the case when forming the portion to be embedded in said holding member.

13. The process according to claim 11, wherein said second electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

14. The process according to claim 11, further comprising the step of forming a wiring pattern on one or both surfaces of said holding member.

15. The process according to claim 11, wherein said second electroconductive member as filled forms an electrical connecting portion to be connected to the connecting portion of an electrical circuit part, and said electrical connecting portion are connected metallurgically.

16. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:

laminating on a base member a first photosensitive resin, a second photosensitive resin which is different in photosensitive wavelength band from said first photosensitive resin and becomes said holding member and a third photosensitive resin different in photosensitive wavelength band from said second photosensitive resin in the order mentioned;

exposing said first, said second and said third photosensitive resins respectively to predetermined patterns by irradiation of lights with the photosensitive wavelength bands of said first, said second and said third photosensitive resins, followed by developing, to form a plurality of holes through the respective photosensitive resins, thereby exposing said base member;

filling an electroconductive member in said holes formed on said photosensitive resins; and removing said first and said third photosensitive resins and said base member.

17. The process according to claim 16, wherein filling of said electroconductive member is performed by electroplating, and the filling conditions by electroplating are made higher in at least one of temperature of the plating solution and the current density in the case of forming the portion to be protruded from said holding member, as compared with the case when forming the portion to be embedded in said holding member.

18. The process according to claim 16, wherein said electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

19. The process according to claim 16, further comprising the step of forming a wiring pattern on one or both surface of said holding member.

20. The process according to claim 16, wherein the photosensitive wavelength band of said third photosensitive resin is different from that of said first photosensitive resin.

21. The process according to claim 16, wherein said electroconductive member as filled forms an electrical connecting portion to be connected to the connecting portion of an electrical circuit part, and said connecting portion and said electrical connecting portion are connected metallurgically.

22. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:

providing a first photosensitive resin on a base member end exposing it to a first predetermined pattern;

providing on said first photosensitive resin a second photosensitive resin which is different in photosensitive wavelength band from said first photosensitive resin and becomes said holding member and exposing it to a second predetermined pattern;

providing on said second photosensitive resin a third photosensitive resin different in photosensitive wavelength band from said second photosensitive resin and exposing it to a third predetermined pattern;

developing said first, said second and said third photosensitive resins to form a plurality of holes, thereby exposing said base member;

filling an electroconductive member in said holes formed in said respective photosensitive resins; and removing said first and said third photosensitive resins and said base member.

23. The process according to claim 22, wherein filling of said electroconductive member is performed by electroplating, and the filling conditions by electroplating are made higher in at least one of temperature of the plating solution and the current density in the case of forming the portion to be protruded from said holding member, as compared with the case when forming the portion to be embedded in said holding member.

24. The process according to claim 22, wherein said second electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

25. The process according to claim 22, further comprising the step of forming a wiring pattern on one or both surfaces of said holding member.

26. The process according to claim 22, wherein the photosensitive wavelength band of said third photosensitive resin is different from that of said first photosensitive resin.

27. The process according to claim 22, wherein said electroconductive member as filled forms an electrical connecting portion to be connected to the connecting portion of an electrical circuit part, and said connecting portion and said electrical connecting portion are connected metallurgically.

28. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member said process comprising the steps of:

providing a first photosensitive resin on a base member and exposing and developing it to a first predetermined pattern to form a first hole through said first photosensitive resin, thereby exposing said base member;

providing on said first photosensitive resin a second photosensitive resin which is different in photosensitive wavelength band from said first photosensitive resin and becomes said holding member and exposing and developing it to a second predetermined pattern to form a second hole through said second photosensitive resin, thereby exposing said base member;

providing on said second photosensitive resin a third photosensitive resin different in photosensitive wavelength band from said second photosensitive resin and exposing and developing it to a third predetermined pattern to form a third hole through said third photosensitive resin, thereby exposing said base member;

filling an electroconductive member in said first, said second and said third holes; and removing said first and said third photosensitive resins and said base member.

29. The process according to claim 28, wherein filling of said electroconductive member is performed by electroplating, and the filling conditions by electroplating are made higher in at least one of temperature of the plating solution and the current density in the case of forming the portion to be protruded from said holding member, as compared with the case when forming the portion to be embedded in said holding member.

30. The process according to claim 28, wherein said second electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

31. The process according to claim 28, further comprising the step of forming a wiring pattern on one or both surfaces of said holding member.

32. The process according to claim 28, wherein the photosensitive wavelength band of said third photosensitive resin is different from that of said first photosensitive resin.

33. The process according to claim 28, wherein said electroconductive member as filled forms an electrical connecting portion to be connected to the connecting portion of an electrical circuit part, and said connecting portion and said electrical connecting portion are connected metallurgically.

34. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising:

the step A of providing a first photosensitive resin on a base member and exposing and developing it to a first predetermined pattern to form a plurality of first holes through said first photosensitive resin, thereby exposing said base member;

the step B of filling in said first holes a first electroconductive member of a material different from the material of said base member so as to be coplanar with said first photosensitive resin surface;

the step C of providing on the surface formed in step B a second photosensitive resin which becomes said holding member and exposing and developing it to a second predetermined pattern to form a plurality of second holes communicated to said first holes through said second photosensitive resin, thereby exposing said first electroconductive member;

the step D of filling a second electroconductive member in said second holes so as to be coplanar with the surface formed in step C;

the step E of providing a third photosensitive resin on the surface formed in step D and exposing and developing it to a third predetermined pattern to form a plurality of third holes communicated to said second holes through said third photosensitive resin, thereby exposing said second electroconductive member;

the step F of filling a third electroconductive member in said third holes so as to be coplanar with the surface formed in step E; and the step G of removing said first and said third photosensitive resins and said base member.

35. The process according to claim 34, wherein filling of said first, said second and said third electroconductive members is performed by electroplating, and the filling conditions of said first and said third electroconductive member by electroplating are made higher in at least one of temperature of the plating solution and the current density as compared with the case when filling said second electroconductive member.

36. The process according to claim 34, wherein said second electroconductive member is harder than said first electroconductive member and said third electroconductive member.

37. The process according to claim 34, wherein said first photosensitive resin and said second photosensitive resin are different in photosensitive wavelength band, and said second photosensitive resin and said third photosensitive resin are different in photosensitive wavelength band.

38. The process according to claim 37, wherein said first photosensitive resin and said third photosensitive resin are different in photosensitive wavelength band.

39. The process according to claim 34, further comprising the step of depositing a metal layer on the surface formed in step B between step B and step C.

40. The process according to claim 34, further comprising the step of depositing a metal layer on the surface formed in step D between step D and step E.

41. The process according to claim 34, further comprising the step of depositing a first metal layer on the surface formed in step B between step B and step C, and the step of depositing a second metal layer on the surface formed in step D between step D and step E.

42. The process according to claim 34, further comprising the step of forming a wiring pattern on one or both surfaces of said holding member.

43. The process according to claim 34, wherein said first end said third electroconductive member as filled form an electrical connecting portion to be connected to the connecting portion of an electrical circuit part, and said connecting portion and said electrical connecting portion are connected metallurgically.

44. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:
  providing a first photosensitive resin layer on a base member and exposing and developing it to a predetermined pattern to form a plurality of holes through said first photosensitive resin, thereby exposing said base member;
  etching a part of said base member exposed through said holes as formed through said first photosensitive resin layer to form a plurality of concavities on said base member;
  removing said first photosensitive resin layer;
  providing said holding member comprising a second photosensitive resin and exposing and developing it to said predetermined pattern to form a plurality of communicating holes with a diameter larger than that of said concavity through said second photosensitive resin;
  etching a part of said concavities to form hollows with substantially the same diameter as said communicating holes;
  mounting on said holding member a mask having thru-holes formed under the same arrangement state as the concavities provided on said base member with registration so as to match with said holes formed through said holding member;
  filling a second electroconductive member in the thru-holes constituted by the holes of said holding member and the holes of said mask;
  removing said mask; and
  removing said base member.

45. The process according to claim 44, wherein filling of said electroconductive member is performed by electroplating, and the filling conditions of said electroplating are made higher in at least one of temperature of the plating solution and the current density in the case of forming the portion to be protruded from said holding member, as compared with the case when forming the portion to be embedded in said holding member.

46. The process according to claim 44, wherein said second electroconductive member is harder than said first electroconductive member and said third electroconductive member.

47. The process according to claim 44, wherein the holes of said mask are holes having substantially the same shape opposite up and down to the concavities formed on said base member and communicated t the holes of said holding member.

48. The process according to claim 44, further comprising the step of forming a wiring pattern on one or both surfaces of said holding member.

49. The process according to claim 44, wherein said second electroconductive member as filled forms an electrical connecting portion to be connected to the connecting portion of an electrical circuit part, and said connecting portion and said electrical connecting portion are connected metallurgically.

50. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, said process comprising the steps of:
  forming a holding member comprising a photosensitive resin on a base member;
  exposing and developing said holding member to a predetermined pattern to form a plurality of first holes through said holding member, thereby exposing said base member;
  etching a part of said base member exposed by said holes formed on said holding member to form a concavity on said base member;
  mounting a mask provided with second holes with the same predetermined pattern as said first holes on said holding member with registration so as to match with said first holes;
  filling an electroconductive member in the thru-holes constituted by the concavity formed by etching of said base member, the first holes of said holding member and the second holes of said mask;
  removing said mask; and
  removing said base member.

51. The process according to claim 50, wherein filling of said electroconductive member is performed by electroplating, and the filling conditions by electroplating are made higher in at least one of temperature of the plating solution and the current density in the case of forming the portion to be protruded from said holding member, as compared with the case when forming the portion to be embedded in said holding member.

52. The process according to claim 50, further comprising the step of forming a bump by electroplating of an electroconductive material at the end of the electroconductive member protruded on the surface of said holding member after the step of removing said mask.

53. The process according to claim 50, wherein said electroconductive member is a paste and the step of curing the electroconductive paste member is included after the step of filling said electroconductive paste member.

54. The process according to claim 50, further comprising the step of forming a wiring pattern on one or both surfaces of said holding member.

55. The process according to claim 50, wherein said second electroconductive member as filled forms an electrical connecting portion to be connected to the connecting portion of an electrical circuit part, and said connecting portion and said electrical connecting portion are connected metallurgically.

56. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, having the step of forming a holding member comprising a photosensitive resin which becomes said electrical connecting member on a base member, the step of exposing and developing said holding member to a predetermined pattern to form a hole, thereby having the surface of said base member exposed, the step of removing a part of the surface of said base member as exposed by etching, the step of filling an electroconductive member in said hole as formed through said holding member so as to be protruded to a predetermined height from the surface of said holding member by electroplating with said base member as the electrode, and the step of removing said base member which remains, said process comprising the following;

the electroplating conditions of said electroconductive member are such that at least one of the temperature of the plating solution and the current density are made higher in the case of forming the portion protruded from said holding member as compared with the case of forming the portion embedded in said holding member.

57. The process according to claim 56, wherein said electroconductive member is constituted of at least one kind of a first electroconductive material protruded from said holding member and at least one kind of a second electroconductive material different from said first electroconductive material and embedded in at least a part of said holding member, end said second electroconductive material has higher hardness than said first electroconductive material.

58. The process according to claim 56, further comprising the step of forming a wiring pattern on one or both surfaces of said holding member.

59. The process according to claim 56, wherein said electroconductive member as filled forms an electrical connecting portion to be connected to the connecting portion of an electrical circuit part, and said connecting portion and said electrical connecting portion ar connected metallurgically.

60. A process for preparing an electrical connecting member having a holding member comprising an electrically insulating material and a plurality of electroconductive members equipped in said holding member under the state mutually insulated from each other, one end of said each electroconductive member being exposed at one surface of said holding member, and the other end of said each electroconductive member being exposed at another surface of said holding member, having the step of forming a holding member comprising a photosensitive resin which becomes said electrical connecting member on a base member, the step of exposing and developing said holding member to form holes to a predetermined pattern, thereby having the surface of said base member exposed, the step of removing a part of the exposed surface of said base member by etching, the step of filling an electroconductive member in said holes formed through said holding member so as to be protruded to a predetermined height from the surface of said holding member by electroplating with said base member as the electrode and the step of removing said base member which remains, said process comprising the following:

said electroconductive member is constituted of at least one kind of a first electroconductive material protruded from said holding member and at least one kind of a second electroconductive material different from said first electroconductive material and embedded in at least a part of said holding member, and said second electroconductive material has higher hardness than said first electroconductive material.

61. The process according to claim 60, wherein the electroplating, conditions of said electroconductive member are made higher in at least one of temperature of the plating solution and the current density in the case of forming the portion to be protruded from said holding member, as compared with the case when forming the portion to be embedded in said holding member.

62. The process according to claim 60, further comprising the step of forming a wiring pattern on one or both surfaces of said holding member.

63. The process according to claim 60, wherein said electroconductive member as filled forms an electrical connecting portion to be connected to the connecting portion of an electrical circuit part, and said connecting portion and said electrical connecting portion are connected metallurgically.

* * * * *

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 1

Line 19, "parks" should read --parts--.
    Line 45, "is" should be deleted and "protruded" (second occurrence) should be deleted.
    Line 55, "and," should read --and--.

COLUMN 2

Line 54, "old 55" should read --gold 55--.
    Line 63, "to" should be deleted.

COLUMN 3

Line 59, "of" should be deleted.

COLUMN 4

Line 42, "from" should be deleted.
    Line 56, "Of" should read --of--.

COLUMN 5

Line 48, "are schematic diagrams" should read --is a schematic diagram--.

COLUMN 6

Line 15, "through" should read --and--.

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 9

Line 15, "the n" should read --then--.
Line 45, "height" should read --heights--.
Line 54, "5A" should read --5A)--.
Line 55, "coater)." should read --coater.--.

COLUMN 10

Line 2, "Of" should read --of--.
Line 13, "peripheral" should read --periphery--.
Line 64, "carbon" should read --carbon,--.

COLUMN 12

Line 2, "tho" should read --the--.
Line 53, "±he" should read --the--.
Line 57, "trode 305" should read --trode 305)--.

COLUMN 13

Line 67, "member 30I" should read --member 301--.

COLUMN 14

Line 4, "842" should read --342--
Line 4, "Of" should read --of--.
Line 28, "member 30I" should read --member 301--.
Line 63, "a" should read --and a--.

COLUMN 15

Line 27, "a" should read --and a--.

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 16

Line 34, "resin 402a," should read --resin 2a,--.
Line 35, "Of" should read --of--.
Line 46, "resins 402c" should read --resin 402c--.

COLUMN 19

Line 53, "expose" should read --exposed--.

COLUMN 20

Line 54, "being" should read --is--.

COLUMN 21

Line 22, "electrooonduotive" should read --electroconductive--.

COLUMN 22

Line 18, "end" should read --and--.

COLUMN 23

Line 53, "eve" should read --even--.
Line 56, "they" should be deleted.

COLUMN 24

Line 36, "member 34" should read --member 434--.

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 25

Line 14, "en" should read --an--.
Line 31, "f" should read --of--.
Line 41, "part" should read --part of--.
Line 58, "artitrary" should read --arbitrary--.

COLUMN 26

Line 30, "end" should read --and--.
Line 41, "et" should read --at--.
Line 55, "sion" should read --sin--.
Line 63, "solvents, chemical" should read --solvents and chemicals--.
Line 68, "end" should read --and--.

COLUMN 28

Line 48, "Of" should read --of--.

COLUMN 29

Line 8, "end" should read --and--.
Line 15, "projection" should read --projections--.

COLUMN 30

Line 60, "move" should read --moves--.

COLUMN 31

Line 15, "treatments" should read --treatment--.
Line 21, "ere" should read --are--.

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 32

Line 37, "e" should read --a--.
Line 51, "en" should read --an--.
Line 62, "the 706" should read --the mask 706--.

COLUMN 35

Line 10, "Of" should read --of--.
Line 28, "Of" should read --of--.
Line 46, "constitued" should read --constituted--.
Line 55, "to" should read --two--.

COLUMN 36

Line 7, "degree" should read --degrees--.
Line 22, "end" should read --and--.
Line 56, "Ta. Zn." should read --Ta, Zn,--.

COLUMN 37

Line 61, "electrolyric" should read --electrolytic--.

COLUMN 38

Line 18, "the" (second occurrence) should read --electrolytic--.
Line 36, "902a, 902b" should read --902b, 902b--.
Line 45, "that" should be deleted.

UNITED STATES PATENT AND TRADEMARK OFFICE
CERTIFICATE OF CORRECTION

PATENT NO. : 5,135,606

DATED : August 4, 1992

INVENTOR(S) : TOMOAKI KATO, ET AL.

It is certified that error appears in the above-identified patent and that said Letters Patent is hereby corrected as shown below:

COLUMN 39

Line 27, "Yield" should read --yield--.
Line 58, "en" should read --an--.

COLUMN 41

Line 42, "portion" should read --portion and said connecting portion--.

COLUMN 42

Line 24, "surface" should read --surfaces--.
Line 46, "end" should read --and--.

COLUMN 43

Line 34, "member" should read --member,--.

COLUMN 45

Line 33, "end" should read --and-- and "member" should read --members--.

COLUMN 46

Line 24, "t" should read --to--.

COLUMN 47

Line 50, "are" should read --is--.
Line 60, "end" should read --and--.

UNITED STATES PATENT AND TRADEMARK OFFICE
CERTIFICATE OF CORRECTION

PATENT NO. : 5,135,606
DATED : August 4, 1992
INVENTOR(S) : TOMOAKI KATO, ET AL.

It is certified that error appears in the above-identified patent and that said Letters Patent is hereby corrected as shown below:

COLUMN 48

Line 10, "ar" should read --are--.
Line 45, "electroplating," should read --electroplating--.

Signed and Sealed this

Twelfth Day of April, 1994

Attest:

BRUCE LEHMAN

*Attesting Officer*    Commissioner of Patents and Trademarks